US012658265B2

(12) United States Patent
    Zhao et al.

(10) Patent No.: US 12,658,265 B2
(45) Date of Patent: Jun. 16, 2026

(54) MEMORY DEVICES AND OPERATION METHODS THEREOF, AND MEMORY SYSTEMS

(71) Applicant: Yangtze Memory Technologies Co., Ltd., Wuhan (CN)

(72) Inventors: XiangNan Zhao, Wuhan (CN); Chenhui Li, Wuhan (CN); Hongtao Liu, Wuhan (CN); Lei Jin, Wuhan (CN); ZongLiang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 78 days.

(21) Appl. No.: 18/784,049

(22) Filed: Jul. 25, 2024

(65) Prior Publication Data

US 2025/0329394 A1     Oct. 23, 2025

(30) Foreign Application Priority Data

Apr. 17, 2024     (CN) .......................... 202410465218.8

(51) Int. Cl.
    *G11C 16/26*     (2006.01)
    *G11C 16/04*     (2006.01)
    *G11C 16/08*     (2006.01)

(52) U.S. Cl.
    CPC .......... *G11C 16/26* (2013.01); *G11C 16/0483* (2013.01); *G11C 16/08* (2013.01)

(58) Field of Classification Search
    CPC ...... G11C 16/26; G11C 16/0483; G11C 16/08
    See application file for complete search history.

(56) References Cited

U.S. PATENT DOCUMENTS

2016/0147582 A1*  5/2016  Karakulak ............ G06F 11/079
                                                           714/37

* cited by examiner

*Primary Examiner* — Han Yang
(74) *Attorney, Agent, or Firm* — Hanley, Flight & Zimmerman, LLC

(57)     ABSTRACT

An example memory device includes: memory cells constituting memory cell rows coupled to word lines and memory strings coupled to bit lines; and a peripheral circuit configured to: perform a read operation on the memory cells connected to a first word line to obtain at least two read values; during the read operation performed on the memory cells connected to the first word line, divide the memory cells connected to a second word line into at least two groups based on threshold voltages of the memory cells connected to the second word line; and determine read results of the memory cells connected to the first word line from the at least two read values based on grouping information of the memory cells connected to the second word line. The first word line and the second word line are word lines adjacent to each other.

20 Claims, 17 Drawing Sheets

1201

Perform a read operation on the memory cells connected to a first word line to obtain at least two read values

1202

During the read operation performed on the memory cells connected to the first word line, divide the memory cells connected to a second word line into at least two groups based on threshold voltages of the memory cells connected to the second word line

1203

Determine read results of the memory cells connected to the first word line from the at least two read values based on grouping information of the memory cells connected to the second word line, wherein the first word line and the second word line are word lines adjacent to each other

100

Host

108

Memory controller

106

102

Memory device

104

Vread1_pz+ Δ 2

Vread1_pz- Δ 2

Vread1_py+ Δ 2

Vread1_py- Δ 2

Vread1_px+ Δ 2

Vread1_px- Δ 2

Forward read

Vread1_pz+ Δ 2

Vread1_pz- Δ 2

Vread1_py+ Δ 2

Vread1_py- Δ 2

Vread1_px+ Δ 2

Reverse read

Vread1_px- Δ 2

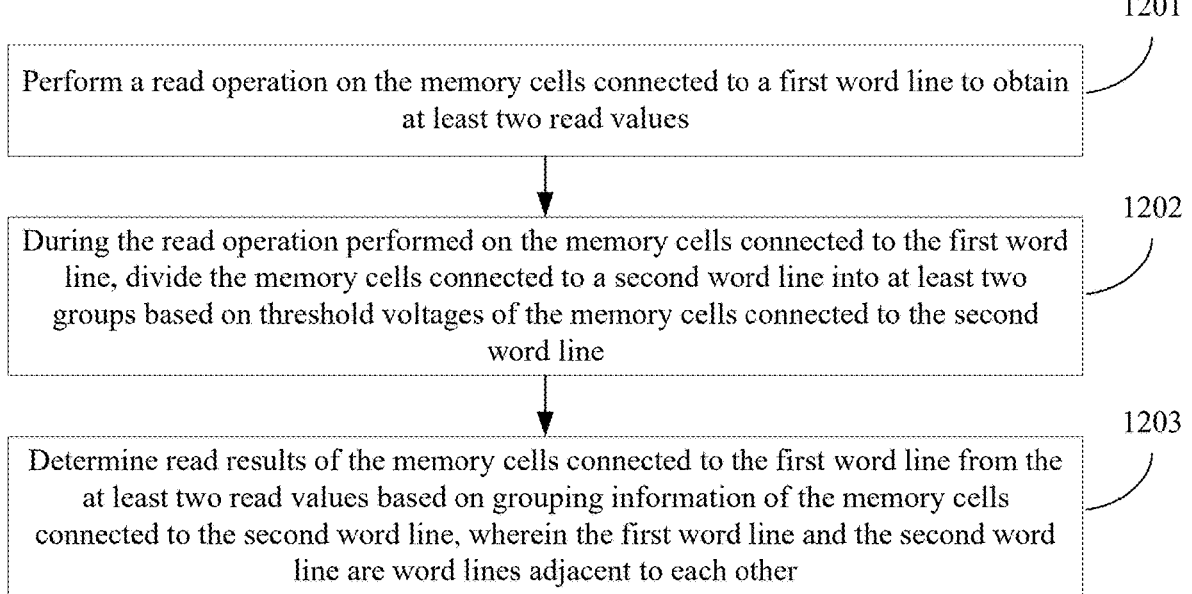

Perform a read operation on the memory cells connected to a first word line to obtain at least two read values During the read operation performed on the memory cells connected to the first word line, divide the memory cells connected to a second word line into at least two groups based on threshold voltages of the memory cells connected to the second word line Determine read results of the memory cells connected to the first word line from the at least two read values based on grouping information of the memory cells connected to the second word line, wherein the first word line and the second word line are word lines adjacent to each other

MEMORY DEVICES AND OPERATION METHODS THEREOF, AND MEMORY SYSTEMS

CROSS-REFERENCE TO RELATED APPLICATION

The present disclosure claims the benefit of priority to China Application No. 202410465218.8, filed on Apr. 17, 2024, the content of which is incorporated herein by reference in its entirety.

TECHNICAL FIELD

Examples of the present disclosure relate to the technical field of semiconductors, and particularly to memory devices and operation methods thereof, and memory systems.

BACKGROUND

A flash memory device is a low-cost, high-density, non-volatile solid-state storage medium that can be electrically erased and reprogrammed. The flash memory device comprises a NOR flash memory device and a NAND flash memory device. Various operations such as read, program (write), and erase can be performed by the flash memory device to change a threshold voltage of each memory cell to a desired level. For the NAND flash memory device, the erase operation can be performed in memory blocks, and the program operation or read operation can be performed in pages.

BRIEF DESCRIPTION OF THE DRAWINGS

FIG. 12 is a flow diagram of implementing an operation method of a memory device provided by an example of the present disclosure.

DETAILED DESCRIPTION

Figure 1:
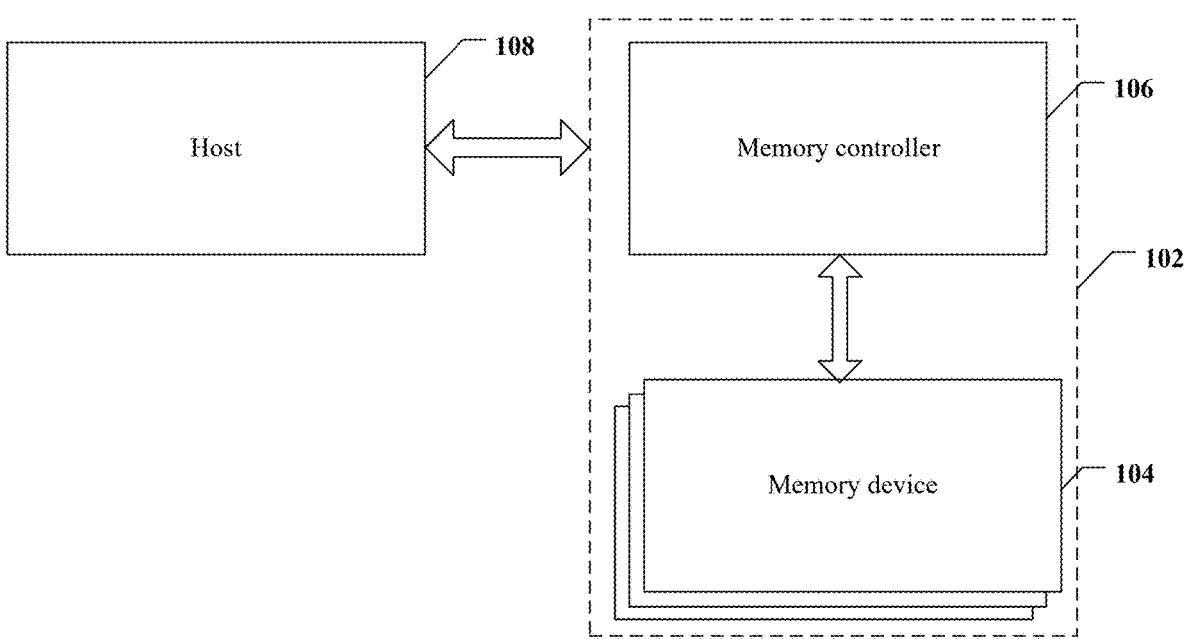
FIG. 1 is a schematic diagram of an example system having a memory system according to an example of the present disclosure.

The technical solutions in implementations of the present disclosure will be described below clearly and completely in conjunction with the implementations and the drawings of the present disclosure. Apparently, the implementations described are only part, but not all, of the implementations of the present disclosure. All other implementations obtained by those of ordinary skills in the art based on the implementations in the present disclosure without creative work shall fall within the scope of protection of the present disclosure.

In the following descriptions, a lot of details are given in order to provide the more thorough understanding of the present disclosure. However, it is apparent to those skilled in the art that the present disclosure may be implemented without one or more of these details. In other examples, in order to avoid confusion with the present disclosure, some technical features well-known in the field are not described. That is, not all the features of the actual examples are described here, and well-known functions and structures are not described in detail.

In the drawings, the sizes of a layer, a region, and an element and their relative sizes may be exaggerated for clarity. Like reference numerals denote like elements throughout the specification.

It is to be understood that when an element or a layer is referred to as being "on", "adjacent to", "connected to", or "coupled to" other elements or layers, it may be directly on, adjacent to, connected to, or coupled to the other elements or layers, or intervening elements or layers may be present. In contrast, when an element is referred to as being "directly on", "immediately adjacent to", "directly connected to", or "directly coupled to" other elements or layers, no intervening elements or layers are present. It is to be understood that, although terms first, second, third and the like may be used to describe various elements, components, regions, layers and/or parts, these elements, components, regions, layers and/or parts should not be limited by these terms. These terms are only used to distinguish one element, component, region, layer or part from another element, component, region, layer or part. Thus, a first element, component, region, layer or part discussed below may be represented as a second element, component, region, layer or part, without departing from the teachings of the present disclosure. However, when the second element, component, region, layer or part is discussed, it does not mean that the first element, component, region, layer or part is necessarily present in the present disclosure.

The spatially relative terms, such as "beneath", "below", "lower", "under", "over", "upper", etc, may be used here for ease of description to describe the relationship between one element or feature and other elements or features as illustrated in the figures. It is to be understood that, the spatially relative terms are intended to further encompass different orientations of a device in use or operation in addition to the orientation depicted in the figures. For example, if the device in the drawings is flipped, then the elements or the features described as "below" or "under" or "beneath" other elements may be oriented "on" the other elements or features. Thus, the example terms "below" and "beneath" may comprise both upper and lower orientations. The device may be orientated otherwise (rotated by 90 degrees or other orientations), and the spatially descriptive words used here are interpreted accordingly.

The terms used here are only intended to describe the specific examples, and are not used as limitations to the present disclosure. As used here, unless otherwise indicated expressly in the context, "a", "an" and "the" in a singular form are also intended to comprise a plural form. It should also be understood that terms "consist of" and/or "comprise", when used in this specification, determine the presence of the described features, integers, steps, operations, elements and/or components, but do not preclude the presence or addition of one or more other features, integers, steps, operations, elements, components, and/or groups. As used here, a term "and/or" comprises any and all combinations of related items listed.

In order to understand the present disclosure thoroughly, detailed operations and detailed structures will be proposed in the following description to set forth the technical solution of the present disclosure. The detailed descriptions of the preferred examples of the present disclosure are as follows. However, the present disclosure may also have other implementations in addition to these detailed descriptions.

A memory device in an example of the present disclosure includes, but is not limited to, a three-dimensional NAND memory. For ease of understanding, the three-dimensional NAND memory is used as an example for description.

FIG. 1 is a block diagram of an example system 100 having a memory device according to some aspect of the present disclosure. The system 100 may be a mobile phone, a desktop computer, a laptop computer, a tablet, a vehicle computer, a gaming console, a printer, a positioning apparatus, a wearable electronic apparatus, a smart sensor, a Virtual Reality (VR) apparatus, an Augmented Reality (AR) apparatus, or any other suitable electronic apparatus having a memory therein. As shown in FIG. 1, the system 100 may comprise a host 108 and a memory system 102 having one or more memory devices 104 and a memory controller 106. The host 108 may be a processor of an electronic apparatus, such as a Central Processing Unit (CPU), or a System-on-a-chip (SoC), such as an Application Processor (AP). The host 108 may be configured to send or receive data to or from the memory device 104.

According to some implementations, the memory controller 106 is coupled to the memory device 104 and the host 108, and is configured to control the memory device 104. The memory controller 106 may manage data stored in the memory device 104, and communicate with the host 108. In some implementations, the memory controller 106 is designed for operating in a low duty-cycle environment like Secure Digital (SD) cards, Compact Flash (CF) cards, Universal Serial Bus (USB) flash drives, or other media for use in electronic apparatuses, such as personal computers, digital cameras, mobile phones, etc. In some implementations, the memory controller 106 is designed for operating in a high duty-cycle environment Solid State Drives (SSDs) or embedded Multi Media Cards (eMMCs) used as data memories for mobile apparatuses, such as smartphones, tablets, laptop computers, etc., and enterprise memory arrays.

The memory controller 106 may be configured to control operations of the memory device 104, such as read, erase, and program operations. The memory controller 106 may further be configured to manage various functions with respect to data stored or to be stored in the memory device 104 including, but not limited to, bad-block management, garbage collection, logical-to-physical address translation, wear leveling, etc. In some implementations, the memory controller 106 is further configured to process Error Checking and Correcting (ECC) codes with respect to the data read from or written to the memory device 104. The memory controller 106 may further perform any other suitable functions as well, for example, formatting the memory device 104. The memory controller 106 may communicate with an external apparatus (e.g., the host 108) according to a particular communication protocol. For example, the memory controller 106 may communicate with the external apparatus through at least one of various interface protocols, such as a USB protocol, an MMC protocol, a Peripheral Component Interconnect (PCI) protocol, a PCI-Express (PCI-E) protocol, an Advanced Technology Attachment (ATA) protocol, a serial-ATA protocol, a parallel-ATA protocol, a Small Computer System Interface (SCSI) protocol, an Enhanced Small Drive Interface (ESDI) protocol, an Integrated Drive Electronics (IDE) protocol, a Firewire protocol, etc.

The memory controller 106 and the one or more memory devices 104 can be integrated into various types of storage apparatuses, for example, be included in the same package, such as a Universal Flash Storage (UFS) package or an eMMC package. That is, the memory system 102 may be implemented and packaged into different types of end electronic products. In one example shown in FIG. 2A, the memory controller 106 and a single memory device 104 may be integrated into a memory card 202. The memory card 202 may comprise a PC (PCMCIA, personal computer memory card international association) card, a Compact Flash (CF) card, a Smart Media (SM) card, a memory stick, a multimedia card (MMC, RS-MMC, MMCmicro), a Secure Digital (SD) card (SD, miniSD, microSD, SDHC), a UFS, etc. The memory card 202 may further comprise a memory card connector 204 coupling the memory card 202 with a host (e.g., the host 108 in FIG. 1). In another example shown in FIG. 2, the memory controller 106 and a plurality of memory devices 104 may be integrated into an SSD 206. The SSD 206 may further comprise an SSD connector 208 coupling the SSD 206 with a host (e.g., the host 108 in FIG. 1). In some implementations, at least one of a storage capacity or an operation speed of the SSD 206 is greater than those of the memory card 202.

Figure 3:
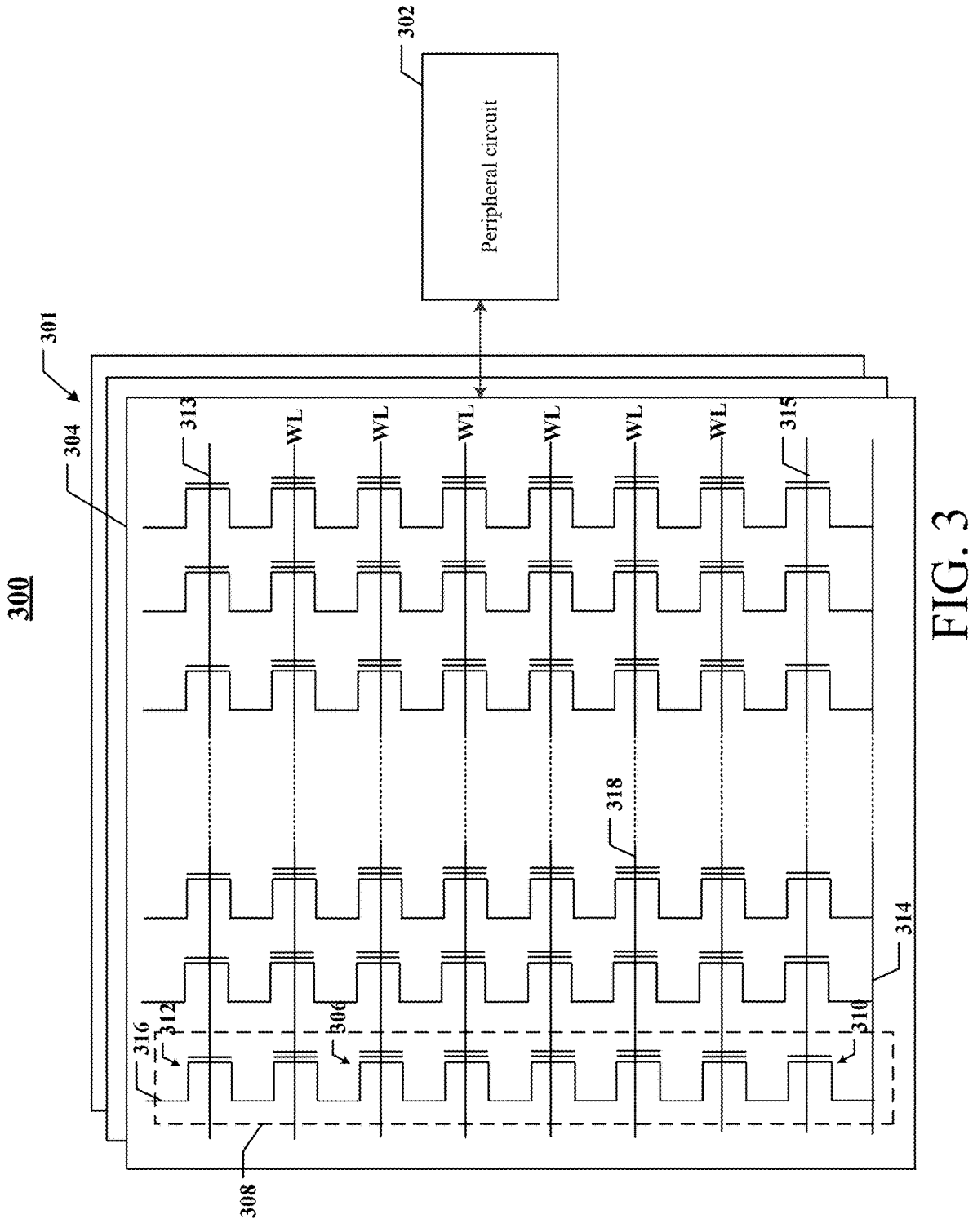
FIG. 3 is a schematic circuit diagram of an example memory device comprising a peripheral circuit according to some aspects of the present disclosure.

FIG. 3 is a schematic circuit diagram of an example memory device 300 comprising a peripheral circuit provided by an example of the present disclosure. The memory device 300 may be an example of the memory device 104 in FIG. 1. The memory device 300 may comprise a memory cell array 301 and a peripheral circuit 302 coupled to the memory cell array 301. For example, the memory cell array 301 is a three-dimensional NAND memory cell array, wherein a memory cell 306 is provided in the form of an array of NAND memory strings 308, and each NAND memory string 308 extends vertically above a substrate (not shown). In some implementations, each NAND memory string 308 comprises a plurality of memory cells 306 coupled in series and stacked vertically. Each memory cell 306 may maintain a continuous analog value, such as voltage or charge, which depends on the number of electrons trapped within a region of the memory cell 306. Each memory cell 306 may be either a floating gate type memory cell comprising a floating gate transistor, or a charge trapping type memory cell comprising a charge trapping transistor.

In some implementations, each memory cell 306 is a Single-level Cell (SLC) that has two possible memory states and thus may store one bit of data. For example, a first memory state "0" may correspond to a first voltage range, and a second memory state "1" may correspond to a second voltage range. In some implementations, each memory cell 306 is a Multi-Level Cell (MLC) that can store more than one bit of data in more than four memory states. For example, the MLC may store two bits per cell, three bits per cell (also referred to as a Trinary-Level Cell (TLC)), or four bits per cell (also referred to as a Quad-Level Cell (QLC)).

As shown in FIG. 3, each NAND memory string 308 may comprise a Bottom Select Gate (BSG) 310 at a source end thereof and a Top Select Gate (TSG) 312 at a drain end thereof. The BSG 310 and the TSG 312 may be configured to activate a selected NAND memory string 308 during a read operation and a program operation. In some implementations, sources of the NAND memory strings 308 in a same memory block 304 are coupled through a same Source Line (SL) 314 (example e.g., a common SL). In other words, according to some implementations, all the NAND memory strings 308 in the same memory block 304 have an Array Common Source (ACS). According to some implementations, the TSG 312 of each NAND memory string 308 is coupled to a respective Bit Line (BL) 316, and data may be read or written from the bit line 316 via an output bus (not shown). In some implementations, each NAND memory string 308 is configured to be selected or unselected by applying a select voltage (e.g., above a threshold voltage of a transistor having the TSG 312) or an unselect voltage (e.g., 0 V) to a respective TSG 312 via one or more TSG lines 313 and/or by applying a select voltage (e.g., above a threshold voltage of a transistor having the BSG 310) or an unselect voltage (e.g., 0 V) to a respective BSG 310 via one or more BSG lines 315.

As shown in FIG. 3, the NAND memory strings 308 may be organized into a plurality of memory blocks 304, each of which may have a common source line 314 (e.g., coupled to the ground). In some implementations, each memory block 304 is a basic data unit for an erase operation, i.e., all of the memory cells 306 on the same memory block 304 are erased at the same time. In order to erase the memory cells 306 in a selected memory block, the source lines 314 coupled to the selected memory block as well as unselected memory blocks that are in a same plane as the selected memory block can be biased with an erase voltage (Vers) such as a high positive voltage (e.g., 20 V or higher). It is to be understood that in some examples, the erase operation may be performed at a half memory block level, a quarter memory block level, or a level having any suitable number of memory blocks or any suitable fractions of a memory block. The memory cells 306 of adjacent NAND memory strings 308 may be coupled through a word line 318 that selects which row of memory cells 306 is affected by the read operation and the program operation.

Figure 4:
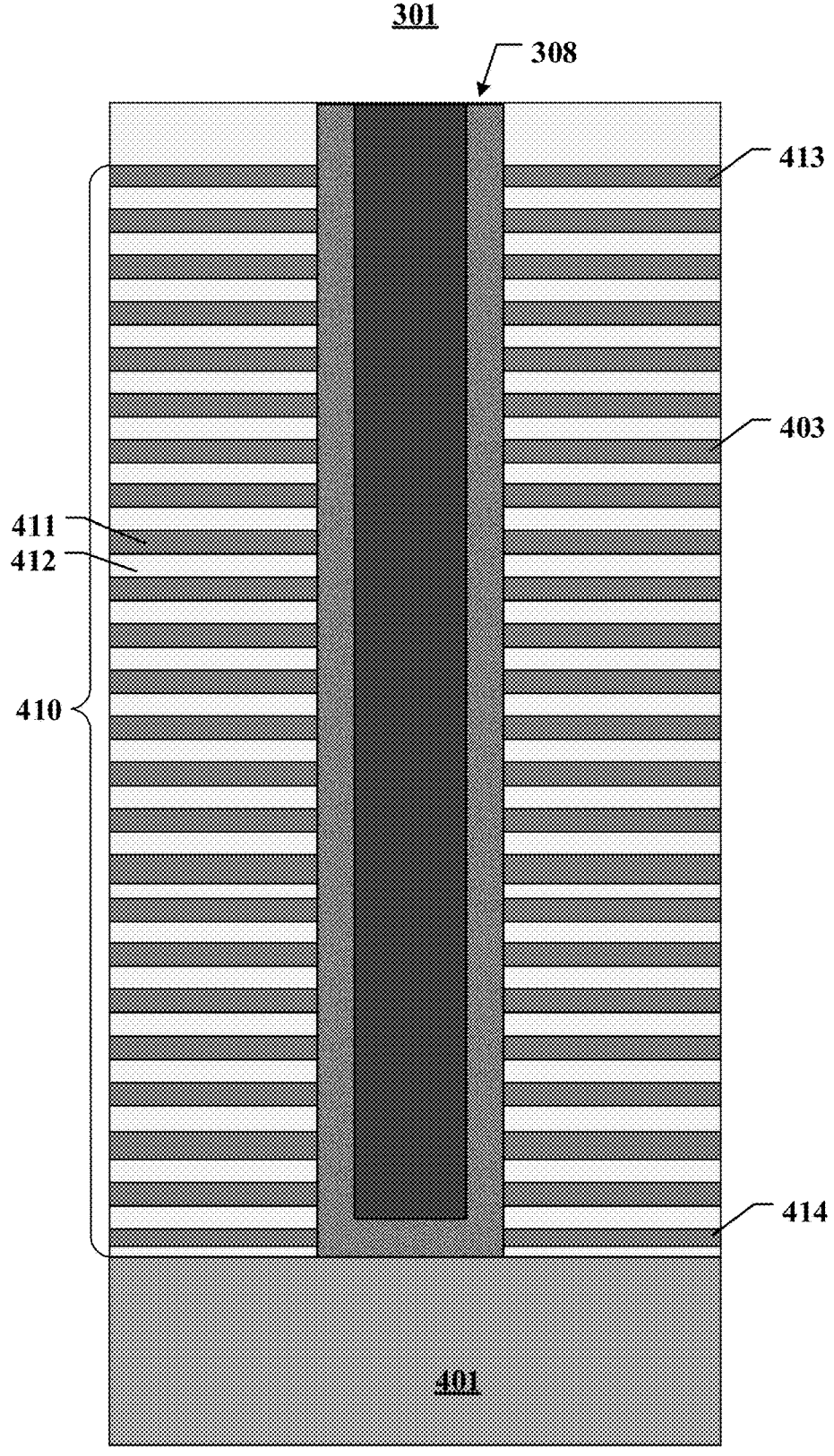
FIG. 4 is a schematic cross-sectional view of a memory cell array comprising a NAND flash memory string according to an example of the present disclosure.

FIG. 4 is a schematic cross-sectional view of an example memory cell array 301 comprising the NAND memory string 308 provided by an example of the present disclosure. As shown in FIG. 4, the NAND memory string 308 may comprise a stack structure 410, which comprises a plurality of gate layers 411 and a plurality of insulation layers 412 sequentially and alternately stacked, and the memory string 308 vertically penetrating through the gate layers 411 and the insulation layers 412. The gate layers 411 and the insulation layers 412 may be alternately stacked, and two adjacent gate layers 411 are spaced apart by one insulation layer 412. The number of pairs of the gate layers 411 and the insulation layers 412 in the stack structure 410 may determine the number of memory cells included in the memory cell array 301.

A constituent material of the gate layers 411 may comprise a conductive material. The conductive material includes, but is not limited to, tungsten (W), cobalt (Co), copper (Cu), aluminum (Al), polysilicon, doped silicon, silicides, or any combination thereof. In some implementations, each gate layer 411 comprises a metal layer, e.g., a tungsten layer. In some implementations, each gate layer 411 comprises a doped polysilicon layer. Each gate layer 411 may comprise a control gate surrounding the memory cell. The gate layer 411 at the top of the stack structure 410 may extend laterally as a top select gate line, the gate layer 411 at the bottom of the stack structure 410 may extend laterally as a bottom select gate line, and the gate layers 411 that extend laterally between the top select gate line and the bottom select gate line may act as word line layers.

In some examples, the stack structure 410 may be disposed on a substrate 401. The substrate 401 may comprise silicon (e.g., single crystalline silicon), silicon germanium (SiGe), gallium arsenide (GaAs), germanium (Ge), a Silicon-on-Insulator (SOI), a Germanium-on-Insulator (GOI), or any other suitable materials.

In some examples, the NAND memory string 308 comprises a channel structure extending through the stack structure 410 vertically. In some implementations, the channel structure comprises a channel hole filled with semiconductor material(s) (e.g., as a semiconductor channel) and dielectric material(s) (e.g., as a memory film). In some implementations, the semiconductor channel comprises silicon, e.g., polysilicon. In some implementations, the memory film is a composite dielectric layer comprising a tunneling layer, a storage layer (also referred to as a "charge trapping/storage layer"), and a blocking layer. The channel structure may have a cylindrical shape (e.g., a pillar shape). According to some implementations, the semiconductor channel, the tunneling layer, the storage layer, and the blocking layer are arranged radially from the center toward the outer surface of the pillar in this order. The tunneling layer may comprise silicon oxide, silicon oxynitride, or any combination thereof. The storage layer may comprise silicon nitride, silicon oxynitride, or any combination thereof. The blocking layer may comprise silicon oxide, silicon oxynitride, a high dielectric constant (high-k) dielectric, or any combination thereof. In one example, the memory film may comprise a composite layer of silicon oxide/silicon oxynitride/silicon oxide (ONO).

Figure 5:
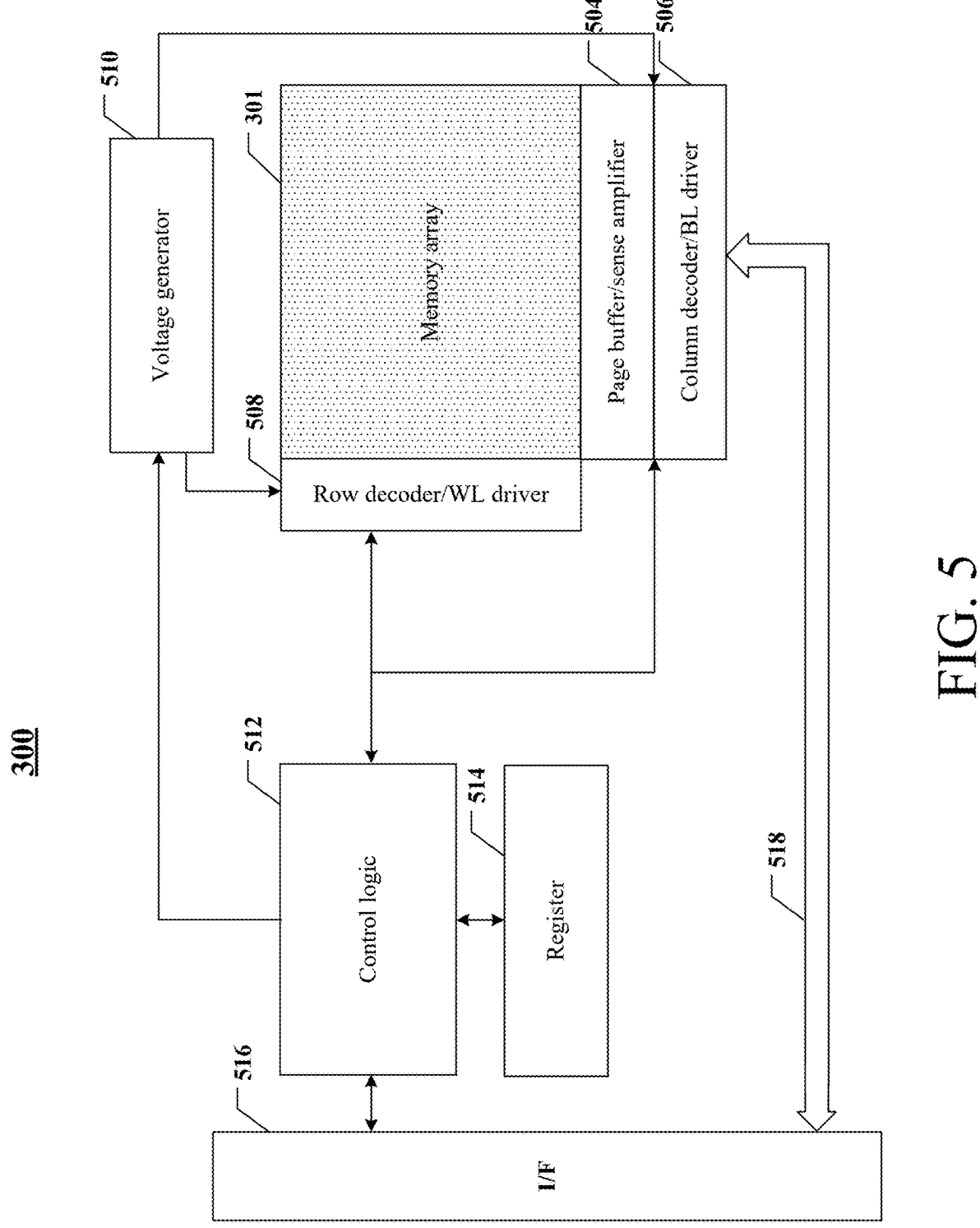
FIG. 5 is a schematic diagram of an example memory device comprising a memory cell array and a peripheral circuit according to an example of the present disclosure.

Referring back to FIG. 3, the peripheral circuit 302 may be coupled to the memory cell array 301 through the bit line 316, the word line 318, the source line 314, the BSG line 315, and the TSG line 313. The peripheral circuit 302 may comprise any suitable analog, digital, and mixed signal circuits for facilitating the operations of the memory cell array 301 by applying and sensing voltage signals and/or current signals to and from each target memory cell 306 via the bit line 316, the word line 318, the source line 314, the BSG line 315, and the TSG line 313. The peripheral circuit 302 may comprise various types of peripheral circuits formed using a Metal-Oxide-Semiconductor (MOS) technology. For example, FIG. 5 shows some example peripheral circuits. The peripheral circuit 302 comprises a page buffer/sense amplifier 504, a column decoder/bit line driver 506, a row decoder/word line driver 508, a voltage generator 510, a control logic 512, a register 514, an interface 516, and a data bus 518. It is to be understood that in some examples, additional peripheral circuits not shown in FIG. 5 may be comprised as well.

The page buffer/sense amplifier 504 may be configured to read and program (write) data from and to the memory cell array 301 according to a control signal from the control logic 512. In one example, the page buffer/sense amplifier 504 may store one page of program data (write data) to be programmed into one page 320 of the memory cell array 301. In another example, the page buffer/sense amplifier 504 may perform a program verification operation to ensure that the data has been properly programmed into the memory cell 306 coupled to a selected word line 318. In still another example, the page buffer/sense amplifier 504 may also sense a low power signal from the bit line 316 that represents a data bit stored in the memory cell 306, and amplifies a small voltage swing to a recognizable logic level in the read operation. The column decoder/bit line driver 506 may be configured to be controlled by the control logic 512 and select one or more NAND memory strings 308 by applying a bit line voltage generated from the voltage generator 510.

The row decoder/word line driver 508 may be configured to be controlled by the control logic 512, select/unselect the memory blocks 304 of the memory cell array 301, and select/unselect the word lines 318 of the memory blocks 304. The row decoder/word line driver 508 may further be configured to drive the word lines 318 using a word line voltage generated from the voltage generator 510. In some implementations, the row decoder/word line driver 508 may also select/unselect and drive the BSG line 315 and the TSG line 313. As described below in detail, the row decoder/word line driver 508 is configured to perform the program operation on the memory cells 306 coupled to selected word line(s) 318. The voltage generator 510 may be configured to be controlled by the control logic 512 and generate the word line voltage (e.g., a read voltage, a program voltage, a pass voltage, a channel boost voltage, a verify voltage, etc.), the bit line voltage, and a source line voltage, which are to be supplied to the memory cell array 301.

The control logic 512 may be coupled to each peripheral circuit described above and configured to control operations of each peripheral circuit. The register 514 may be coupled to the control logic 512 and comprise a state register, a command register, and an address register for storing state information, a command operation code (OP code), and a command address for controlling the operations of each peripheral circuit. The interface 516 may be coupled to the control logic 512, and act as a control buffer to buffer and relay control commands received from a host (not shown) to the control logic 512, and buffer and relay status information received from the control logic 512 to the host. The interface 516 may also be coupled to the column decoder/bit line driver 506 via the data bus 518 and act as a data I/O interface and a data buffer to buffer and relay the data to and from the memory cell array 301.

In the present disclosure, the number of bits stored by each memory cell is not limited. Each memory cell may maintain one of Q possible states, which comprise an erased state S(0) and programmed states S(1) to S(Q-1), wherein Q is an integer equal to or greater than 2. The present disclosure is described by using a TCL with 3 bits stored therein as an example. For the TCL, each memory cell may maintain one of eight memory states, the eight memory states of the TLC may comprise an erased state S(0) and programmed states S(1) to S(7), wherein the programmed state S(1) is the lowest programmed state, and the programmed state S(7) is the highest programmed state.

The TLC has 8 threshold voltage distributions Vt(0) to Vt(7) respectively corresponding to the erased state S(0) and the programmed states S(1) to S(7). In the read operation, a read pass voltage Vpass may be applied to an unselected word line, and a read voltage Vread may be applied to a selected word line WL(n+1). The read pass voltage may exceed a maximum threshold voltage of the memory cell in the highest programmed state to ensure that all the memory cells connected to the unselected word line are turned on, such that memory states of the memory cells connected to the selected word line are determined through the read voltage Vread.

In an example, in the read operation, different read voltages Vread(q) are successively applied to the selected word line, and the read voltages Vread(q) may be set between a maximum threshold voltage of the threshold voltage distribution in a state S(q-1) and a minimum threshold voltage of the threshold voltage distribution in a state S(q), so as to distinguish a threshold voltage in each memory cell. If the applied read voltage Vread(q) is not enough, the memory cell connected to the selected word line is not turned on, and a sensing node (SO) serially connected to a bit line hardly discharges, as a result, the remaining SO voltage of the SO is also high; and next, a next read voltage Vread(q) is continuously applied, until the applied read voltage causes the memory cell connected to the selected word line to be turned on, the SO discharges, and the remaining SO voltage after the end of discharging is related to the threshold voltage of the memory cell connected to the selected word line. Information stored in the memory cell connected to the selected word line may be determined by determining that the SO voltage after the end of discharging falls in which of the threshold voltage distributions Vt(0) to Vt(7) of the 8 states of the TLC. Here, when different read voltages Vread(q) are successively applied to the selected word line, different read voltages Vread(q) may be successively applied from low to high, such a read mode may be referred to as forward read; different read voltages Vread(q) may also be successively applied from high to low, such a read mode may be referred to as reverse read.

An example of the present disclosure provide a memory device and an operation method thereof. The memory device comprises: a memory cell array comprising a plurality of memory cell rows coupled to a plurality of word lines and a plurality of memory strings coupled to a plurality of bit lines, wherein the memory string comprises a plurality of memory cells connected in series; and a peripheral circuit coupled to the memory cell array and configured to: perform read operation performed on the memory cells connected to a first word line to obtain at least two read values; during the read operation performed on the memory cells connected to the first word line, divide the memory cells connected to a second word line into at least two groups based on threshold voltages of the memory cells connected to the second word line; and determine read results of the memory cells connected to the first word line from the at least two read values based on grouping information of the memory cells connected to the second word line, wherein the first word line and the second word line are word lines adjacent to each other.

In some examples, the memory cells connected to the second word line are divided into N groups, and the read operation is performed on the memory cells connected to the first word line to obtain N read values, wherein N is an integer greater than or equal to 2.

In some examples, the memory cells connected to the second word line are divided into N groups based on the threshold voltages of the memory cells connected to the second word line, and the read results of the memory cells connected to the first word line are determined from the N read values by utilizing the grouping information of the memory cells connected to the second word line.

Figure 6A:
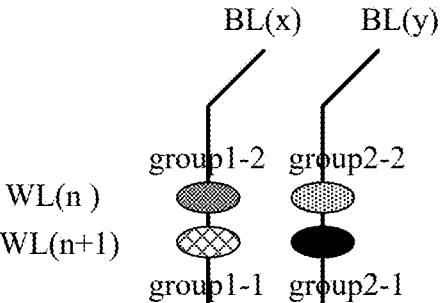
FIG. 6A is a schematic diagram of a coupling effect between adjacent memory cells.
Figure 6B:
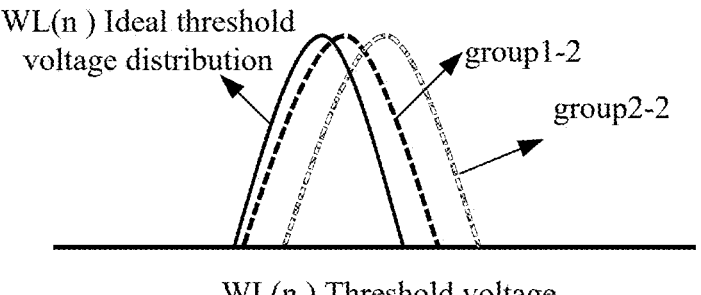
FIG. 6B is a schematic diagram of threshold voltage distribution of memory cells connected to a first word line WL(n)

FIG. 6A is a schematic diagram of a coupling effect between adjacent memory cells, FIG. 6B is a schematic diagram of threshold voltage distributions of memory cells connected to a first word line WL(n), referring to FIGS. 6A and 6B, the memory cells connected to the first word line WL(n) are programmed, and then the memory cells connected to a second word line WL(n+1) are programmed. After the memory cells connected to the second word line WL(n+1) are programmed, threshold voltages of the memory cells connected to the first word line WL(n) are affected by charges on the memory cells connected to the second word line WL(n+1), with a threshold voltage distribution offsetting. Furthermore, offsets of the threshold voltages of the memory cells programmed first (the memory cells connected to the first word line WL(n)) are related to magnitudes of the threshold voltages of the memory cell programmed later (the memory cells connected to the second word line WL(n+1)), and if the threshold voltages of the memory cells programmed later are higher, the offsets of the threshold voltages of the memory cells programmed first adjacent thereto are larger.

During the read operation performed on the memory cells connected to the first word line WL(n), the memory cells connected to the second word line WL(n+1) are first divided into two groups according to the threshold voltages thereof. If a threshold voltage of a memory cell connected to the second word line WL(n+1) is less than a preset voltage, the memory cell belongs to a first group (group 1-1); if a threshold voltage of a memory cell connected to the second word line WL(n+1) is greater than the preset voltage, the memory cell belongs to a second group (group 2-1). In one example, the preset voltage may be a voltage value between the maximum threshold voltage of the threshold voltage distribution Vt(3) and the minimum threshold voltage of the threshold voltage distribution Vt(4) of the TLC. In another example, the preset voltage may be a voltage value between the maximum threshold voltage of the threshold voltage distribution Vt(2) and the minimum threshold voltage of the threshold voltage distribution Vt(3) of the TLC.

As described above, the memory cells belonging to the group 2-1 have a larger impact on the threshold voltages of the memory cells adjacent thereto, and the memory cells belonging to the group 1-1 have a smaller impact on the threshold voltages of the memory cells adjacent thereto. In this case, if the same read operation is performed on the memory cells connected to the first word line WL(n), read errors caused by threshold voltage offsets of the memory cells connected to the second word line WL(n+1) may occur, i.e. information stored in the memory cells programmed first cannot be correctly read. Therefore, in order to correctly read information stored in the memory cells connected to the first word line WL(n), the memory cells connected to the first word line WL(n) may be divided based on grouping information of the memory cells connected to the second word line WL(n+1), for example, the memory cells in the memory cells connected to the first word line WL(n) that are adjacent to the memory cells of the group 1-1 are divided into a first group 1-2, and the memory cells in the memory cells connected to the first word line WL(n) that are adjacent to the memory cells of the group 2-1 are divided into a second group 2-2. Compared to an ideal threshold voltage distribution of the WL(n), a threshold voltage distribution of the group 2-2 has a larger offset, and a threshold voltage distribution of the group 1-2 has a smaller offset. The memory cells of the group 1-1 and the group 1-2 are connected to the same bit line (e.g., BL(x)), and the memory cells of the group 2-1 and the group 2-2 are all connected to the same bit line (e.g., BL(y)). Thus, based on the grouping information of the memory cells connected to the second word line, the memory cells (group 2-2) more affected and the memory cells (group 1-2) less affected in the memory cells connected to the first word line WL(n) may be determined. Thus, by utilizing the grouping information of the memory cells connected to the second word line, which are the read results of the memory cells of the group 1-2 and which are the read results of the memory cells of the group 2-2 are determined from the at least two read values.

According to the memory device of the present disclosure, it is determined that which read value is adopted by the memory cells connected to the first word line adopt as the read result based on the grouping information of the memory cells connected to the second word line, such that a coupling effect between the adjacent memory cells can be effectively corrected.

In some examples, the peripheral circuit is configured to: during the read operation performed on the memory cells connected to the first word line, when the second word line is charged or discharged, obtain a third read value through a third sensing when a voltage on the second word line reaches a preset voltage, and divide the memory cells connected to the second word line into a first group and a second group based on the third read value.

During the read operation performed on the memory cells connected to the first word line WL(n), by charging or discharging the second word line, the third read value is obtained through the third sensing when the voltage on the second word line reaches the preset voltage, and the memory cells connected to the second word line are divided into the first group and the second group based on the third read value. In one example, the third read value is used for representing whether a memory cell of the first word line WL(n) is in conduction state (on) or non-conduction state (off). If the memory cell is in the conduction state, the threshold voltage of the memory cell does not exceed (less than) the preset voltage, and the memory cell belongs to the first group (group 1-1); if the memory cell is in the non-conduction state, the threshold voltage of the memory cell exceeds the preset voltage, and the memory cell belongs to the second group (group 2-1).

In an example of the present disclosure, a grouping process of the memory cells connected to the second word line is arranged in a pre-charging stage of the first word line, such that the threshold voltages of the memory cells connected to the second word line do not need to be acquired through an extra read operation, thereby improving read efficiency.

In some examples, the peripheral circuit is configured to: in the pre-charging stage of the read operation performed on the memory cells connected to the first word line, during application of a read pass voltage to the second word line, obtain the third read value through the third sensing when the voltage on the second word line is charged to the preset voltage, and divide the memory cells connected to the second word line into the first group and the second group based on the third read value; or in the pre-charging stage of the read operation performed on the memory cells connected to the first word line, after the read pass voltage is applied to the second word line, obtain the third read value through the third sensing when the voltage on the second word line is discharged to the preset voltage, and divide the memory cells connected to the second word line into the first group and the second group based on the third read value.

The read operation generally comprises an initialization (Initial) stage, a pre-charging (Prepulse) stage, a sensing (Read) stage, a discharging (Postpulse) stage, and a recovery (Recovery) stage. A TSG configured to control a selected memory cell string is used as a selected TSG (Sel TSG), and the rest of TSGs are used as unselected TSGs (Unsel TSG); a word line coupled with memory cells to be read is used as a selected word line (Sel WL), and the rest of word lines are used as unselected word lines (Unsel WL). Various elements in the memory device are initialized in the initialization stage to prepare for subsequent read operations. The word line is pre-charged in the pre-charging stage, the read pass voltage Vpass is generally applied to the word line to ensure that all memory cells connected to the unselected word line are turned on, and Vtsg is applied to the selected TSG and the unselected TSG to turn on the TSG, so as to cause the memory cell string to be connected to the bit line. Generally, after the Vtsg is applied to the unselected TSG, the unselected TSG may be turned off quickly, such that channel charges of an unselected memory cell string are exported through an ACS, and a channel potential thereof reduces quickly, thereby reducing read disturbance of the unselected memory cell string. In the sensing stage, i.e. a respective read voltage Vread is applied to the selected word line, and the read pass voltage Vpass is applied to the unselected word line, data stored in a memory cell connected on the selected word line is sensed through the bit line. During a discharging process and a recovery process, discharging recovery is performed on voltages of the word line, the bit line, the channel, the substrate, etc. to prevent the voltage and current on the memory cell from affecting the accuracy of the subsequent read operations.

Figure 7A:
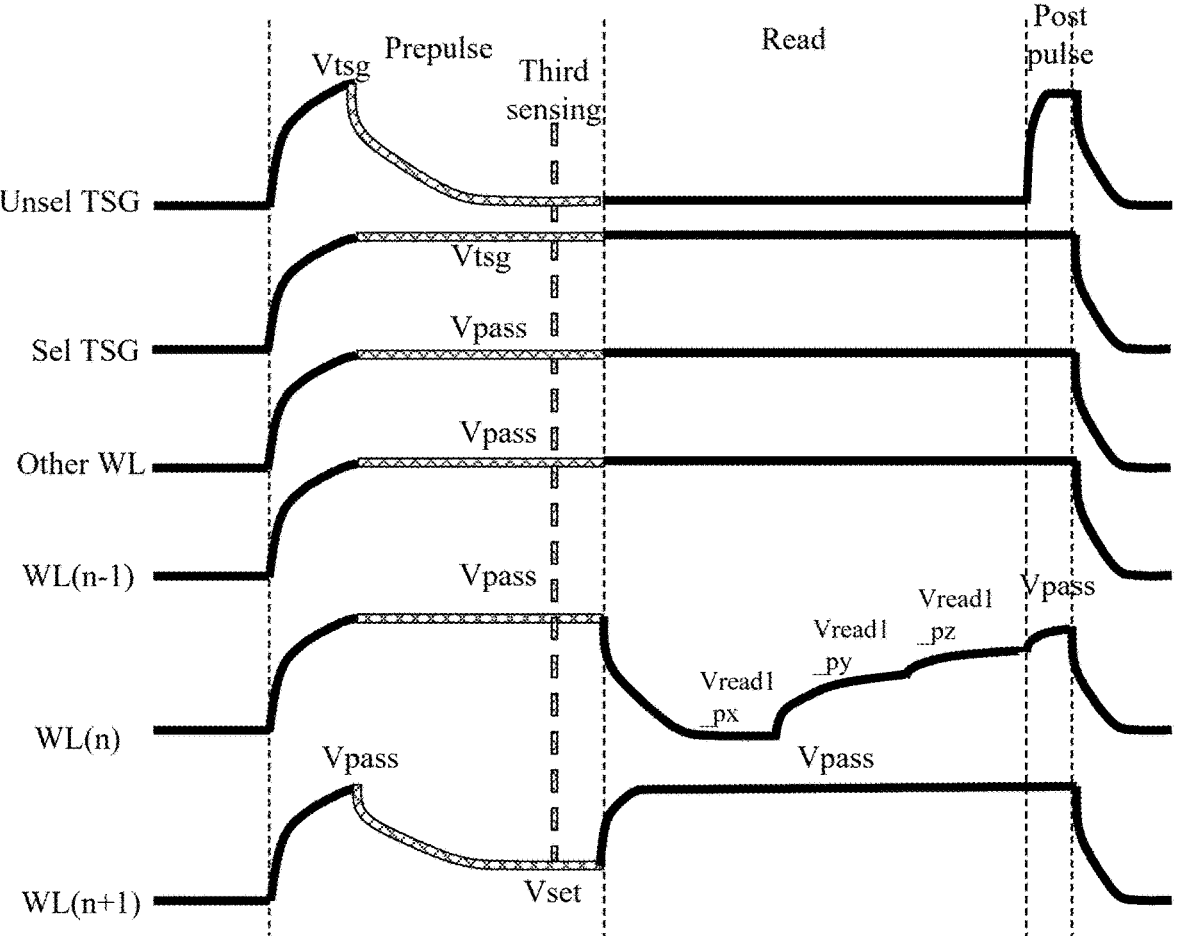
FIG. 7A is an example voltage solution I of a read operation provided by an example of the present disclosure.
Figure 7B:
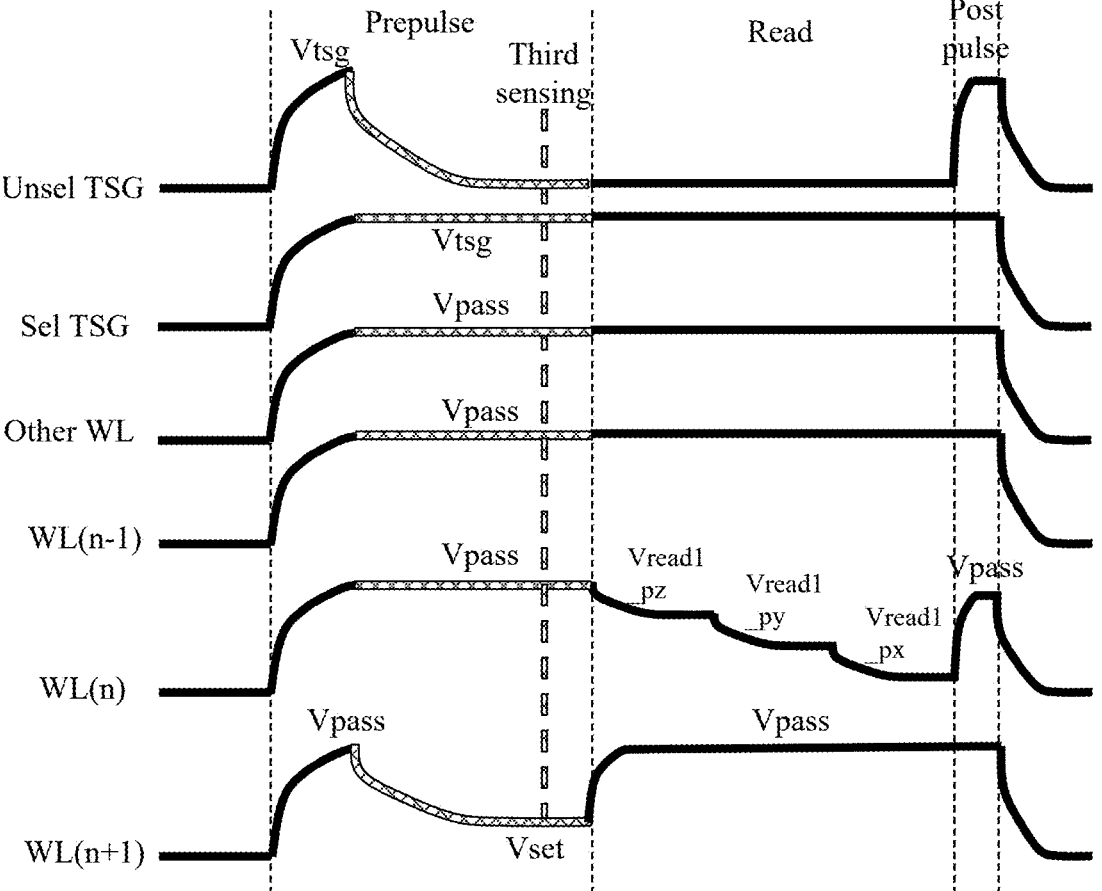
FIG. 7B is an example voltage solution II of a read operation provided by an example of the present disclosure.

FIG. 7A is an example voltage solution I of a read operation provided by an example of the present disclosure, FIG. 7B is an example voltage solution II of a read operation provided by an example of the present disclosure, referring to FIGS. 7A and 7B, in the pre-charging stage of the read operation performed on the memory cells connected to the first word line WL(n), during application of the read pass voltage Vpass to the second word line WL(n+1), the third read value is obtained through the third sensing when the voltage on the second word line WL(n+1) is charged to the preset voltage Vset. After the third sensing is performed, the voltage on the second word line WL(n+1) is continuously charged to the read pass voltage Vpass. Whether the threshold voltage of the memory cell connected to the second word line is greater than the preset voltage or less than the preset voltage may be obtained based on the third read value. Therefore, the memory cells connected to the second word line are grouped based on a relationship with the preset voltage. A difference between FIG. 7A and FIG. 7B lies in that the first word line in FIG. 7A performs the read operation in a forward read manner, the first word line in FIG. 7B performs the read operation in a reverse read manner.

It is to be noted that, WL(n+1) and WL(n−1) are word lines adjacent to WL(n), and the memory cells connected to WL(n+1) are programmed before the memory cells connected to WL(n) are programmed. Other WLs are WLs other than WL(n−1), WL(n), and WL(n+1). Here, WL(n) is the selected word line.

Here, Vread1_px, Vread1_py, and Vread1_pz are read voltages. It is to be further noted that, the number of times for applying the read voltages is only an example, and is not used to limit the required number of times for applying the read voltages in each read operation in the present disclosure.

Figure 8A:
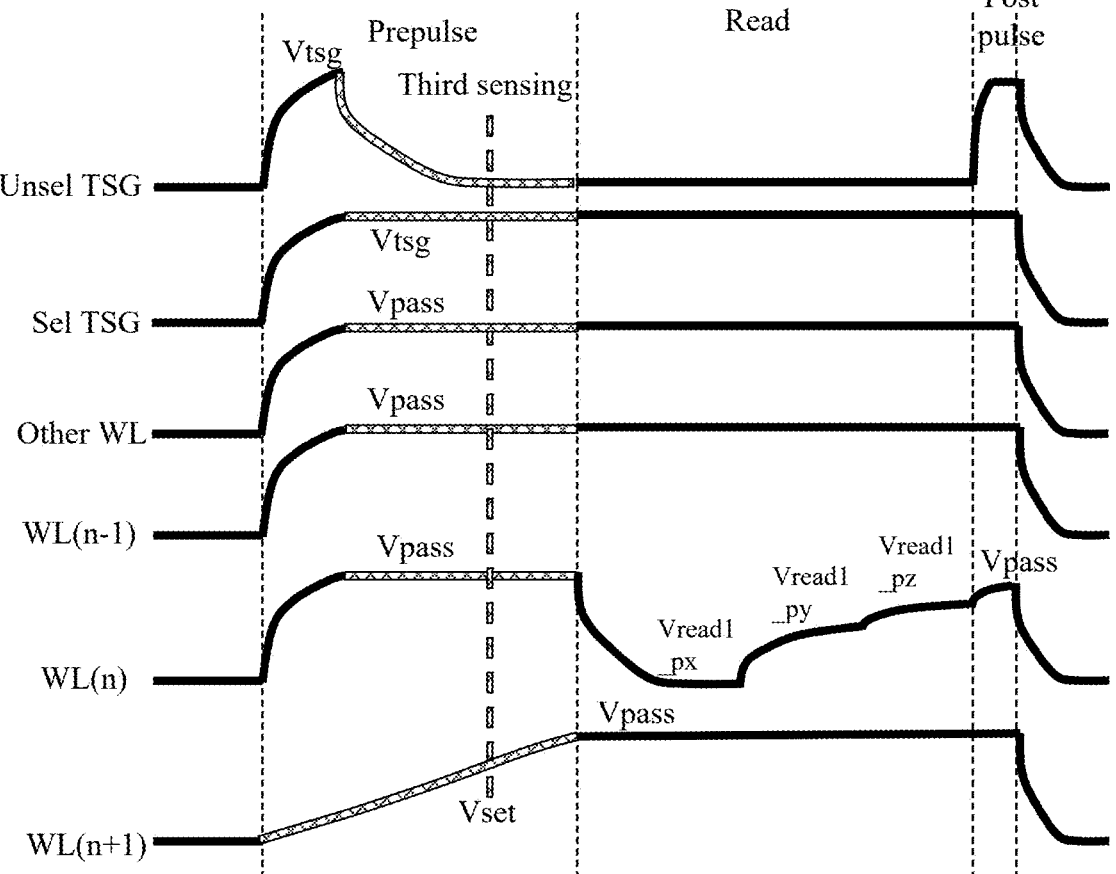
FIG. 8A is an example voltage solution III of a read operation provided by an example of the present disclosure.
Figure 8B:
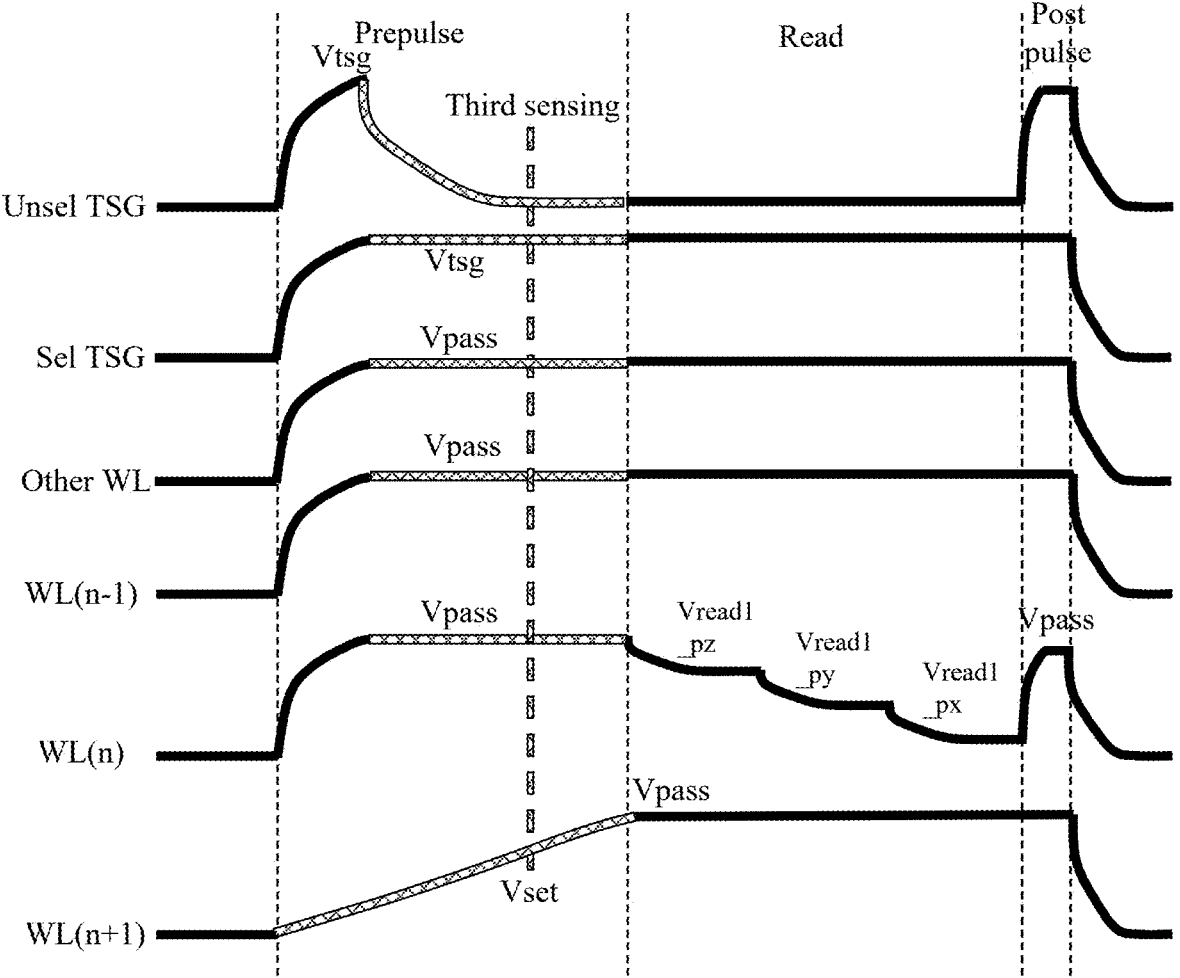
FIG. 8B is an example voltage solution IV of a read operation provided by an example of the present disclosure.

FIG. 8A is an example voltage solution III of a read operation provided by an example of the present disclosure, FIG. 8B is an example voltage solution IV of a read operation provided by an example of the present disclosure, referring to FIGS. 8A and 8B, in the pre-charging stage of the read operation performed on the memory cells connected to the first word line WL(n), after the read pass voltage Vpass is applied to the second word line WL(n+1), the second word line WL(n+1) is discharged, and the third read value is obtained through the third sensing when the voltage on the second word line WL(n+1) is discharged to the preset voltage. After the third sensing is performed, the second word line WL(n+1) is continuously charged to the read pass voltage Vpass. Whether the threshold voltage of the memory cell connected to the second word line is greater than the preset voltage or less than the preset voltage may be obtained based on the third read value. Therefore, the memory cells connected to the second word line are grouped based on a relationship with the preset voltage. A difference between FIG. 8A and FIG. 8B lies in that the first word line in FIG. 8A performs the read operation in a forward read manner, the first word line in FIG. 8B performs the read operation in a reverse read manner.

In an the example of the present disclosure, a process of acquiring the threshold voltages of the memory cells connected to the second word line is arranged in the pre-charging stage of the first word line, such that an extra read operation of the second word line is avoided, thereby improving the read efficiency.

In some examples, the peripheral circuit is configured to: in a discharging stage of the read operation performed on the memory cells connected to the first word line, when the second word line is discharged from the read pass voltage, obtain the third read value through the third sensing when the voltage on the second word line is discharged to the preset voltage, and divide the memory cells connected to the second word line into the first group and the second group based on the third read value.

Figure 9A:
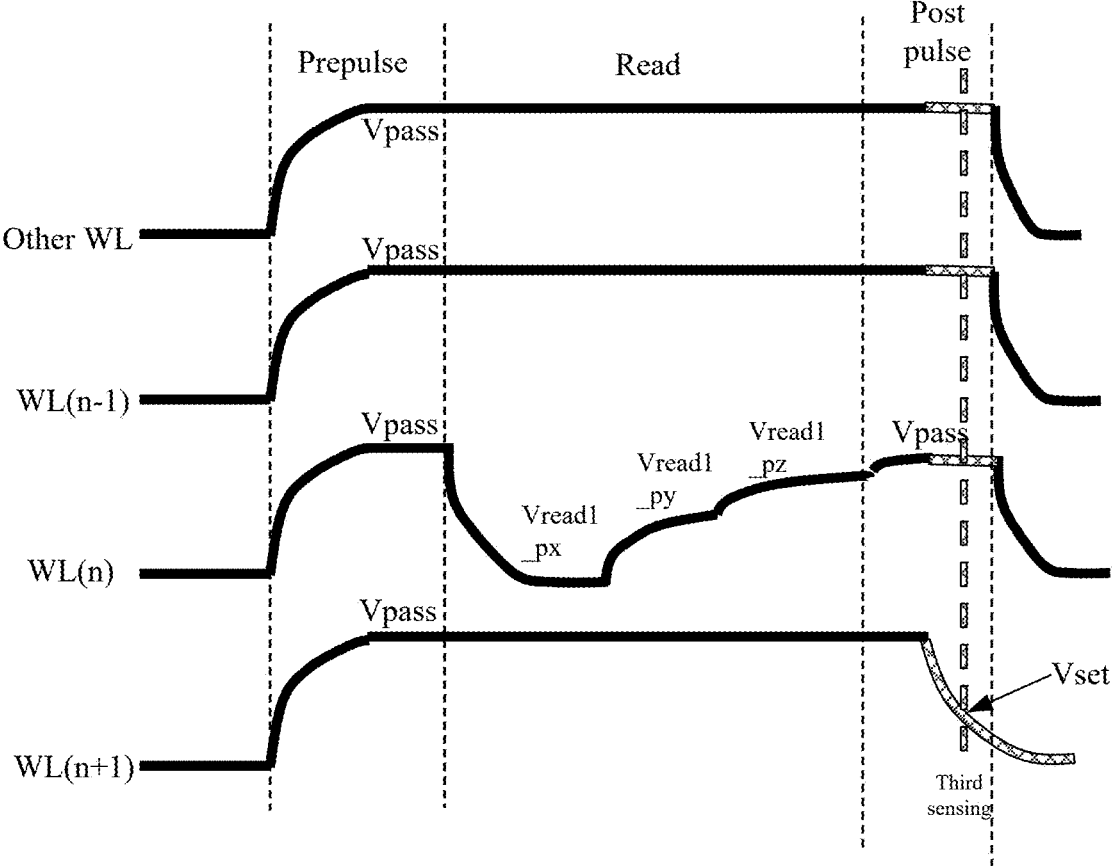
FIG. 9A is an example voltage solution V of a read operation provided by an example of the present disclosure.
Figure 9B:
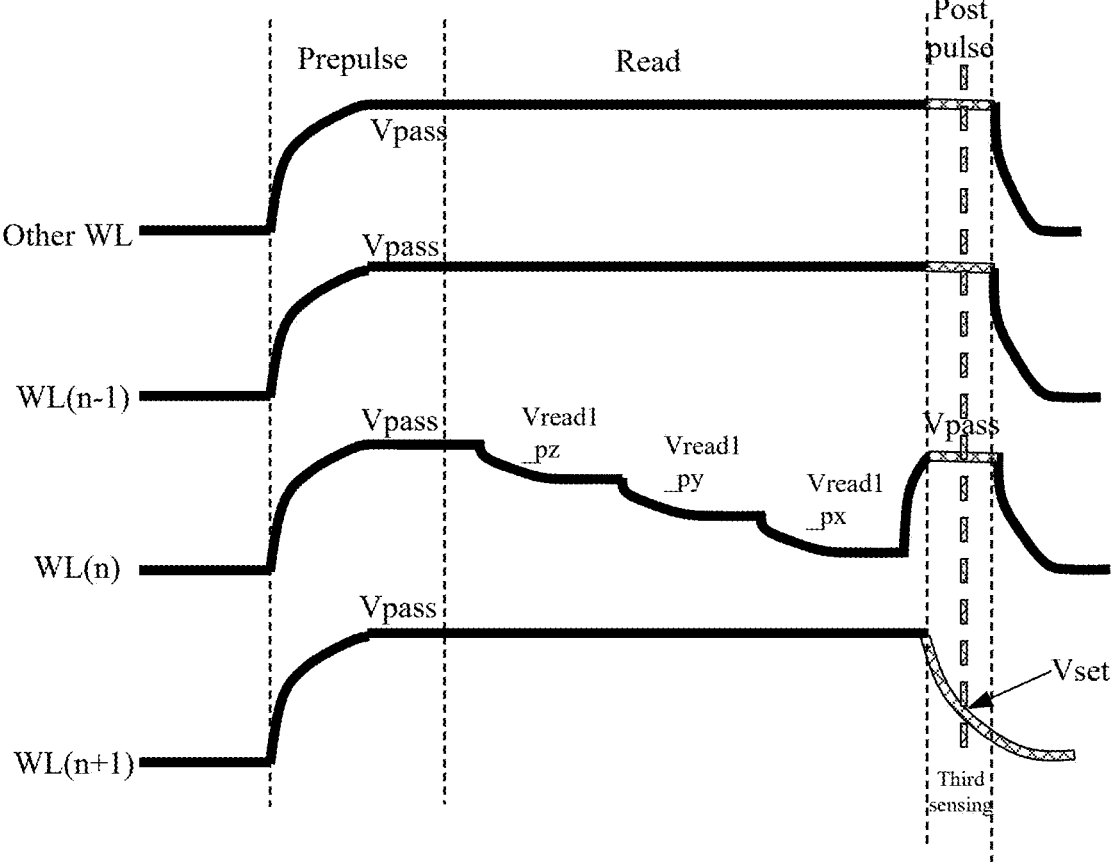
FIG. 9B is an example voltage solution VI of a read operation provided by an example of the present disclosure.

FIG. 9A is an example voltage solution V of a read operation provided by an example of the present disclosure, FIG. 9B is an example voltage solution VI of a read operation provided by an example of the present disclosure, referring to FIGS. 9A and 9B, in the discharging stage of the read operation performed on the memory cells connected to the first word line WL(n), when the second word line is discharged from the read pass voltage, the third read value is obtained through the third sensing when the voltage on the second word line is discharged to the preset voltage. After the third sensing is performed, the voltage on the second word line WL(n+1) is continuously discharged to a ground voltage Vss. Whether the threshold voltage of the memory cell connected to the second word line is greater than the preset voltage or less than the preset voltage may be obtained based on the third read value. Therefore, the memory cells connected to the second word line are grouped based on a relationship with the preset voltage. A difference between FIG. 9A and FIG. 9B lies in that the first word line in FIG. 9A performs the read operation in a forward read manner, the first word line in FIG. 9B performs the read operation in a reverse read manner.

In an example of the present disclosure, the process of acquiring the threshold voltages of the memory cells connected to the second word line is arranged in the discharging stage of the first word line, such that the extra read operation of the second word line is avoided, thereby improving the read efficiency.

In some examples, the peripheral circuit is configured to: after applying a first read voltage to the first selected word line, respectively obtain, through consecutive first sensing and second sensing, a first read value corresponding to the first sensing and a second read value corresponding to the second sensing, wherein the first sensing and the second sensing have different sensing times.

In order to correctly read the information stored in the memory cells connected to the first word line WL(n), the first read voltage may be applied to the first word line WL(n), an sensing node (SO) is enabled to present two different potentials by adjusting sensing time of the SO, so as to realize two consecutive sensing, thereby obtaining two read values, and it is subsequently determined that which read value is adopted by the memory cells connected to the first word line as the read result based on the grouping information of the memory cells connected to the second word line WL(n+1). Then read errors caused by threshold voltage offsets of the memory cells of the group 1-2 and the memory cells of the group 2-2 are eliminated.

In an example of the present disclosure, the first read voltage has a first offset compared to a default read voltage (Default Vread). In some examples, the first offset of the first read voltage compared to the default read voltage is to compensate the threshold voltage offsets of the memory cells due to charge loss.

In some examples, the sensing time of the first sensing is less than the sensing time of the second sensing, and threshold voltages of the memory cells of the first group are less than threshold voltages of the memory cells of the second group. The peripheral circuit is configured to: determine the first read value as read result of the memory cell among the memory cells connected to the first word line that is adjacent to the memory cell of the first group; and determine the second read value as read result of the memory cell among the memory cells connected to the first word line that is adjacent to the memory cell of the second group.

Figure 10:
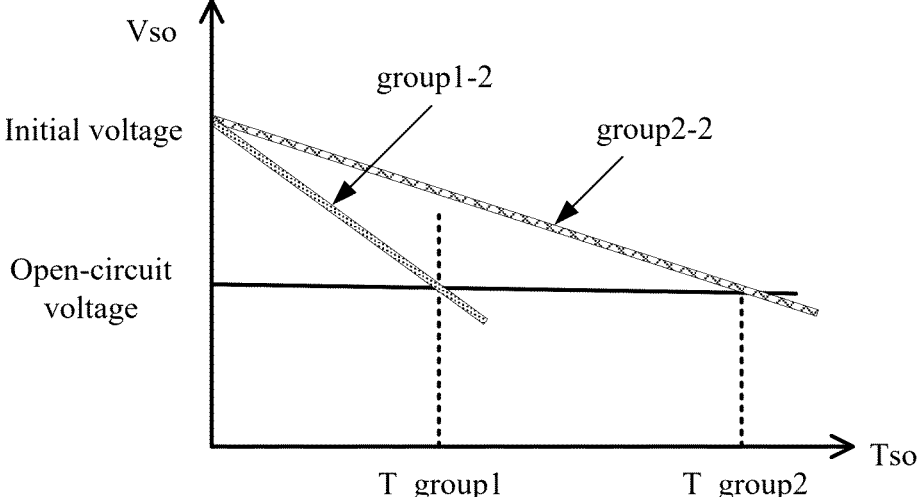
FIG. 10 is a schematic diagram of a discharging curve of a sensing node provided by an example of the present disclosure.

FIG. 10 is a schematic diagram of a discharging curve of a sensing node provided by an example of the present disclosure, as shown in FIG. 10, a sensing process is to charge the sensing node SO to make the sensing node SO reach an initial voltage, and to discharge the sensing node SO; and after a predetermined sensing time, a sensing result is obtained according to a sensing voltage of the sensing node SO, and the sensing result may be used for determining the threshold voltage of the memory cell. If the threshold voltage of the memory cell of the group 2-1 is relatively high, the memory cell of the group 2-1 results in relatively large threshold voltage offset of the memory cell of the group 2-2 adjacent thereto, and the relatively large threshold voltage offset of the memory cell of the group 2-2 results in slow discharging of the sensing node SO coupled to the memory cell of the group 2-2 when information stored in the memory cell of the group 2-2 is read, i.e. the time T_group2 for discharging the sensing node SO coupled to the memory cell of the group 2-2 from the initial voltage to an open-circuit voltage is relatively long; if the threshold voltage of the memory cell of the group 1-1 is relatively low, the memory cell of the group 1-1 results in relatively small threshold voltage offset of the memory cell of the group 1-2 adjacent thereto, and the relatively small threshold voltage offset of the memory cell of the group 1-2 results in fast discharging of the sensing node SO coupled to the memory cell of the group 1-2 when information stored in the memory cell of the group 1-2 is read, i.e. the time T_group1 for discharging the sensing node SO coupled to the memory cell of the group 1-2 from the initial voltage to the open-circuit voltage is relatively short. The T_group2 is greater than the T_group1. Based on this, in order to correctly read the information stored in the memory cell of the group 1-2 and the memory cell of the group 2-2, the same read voltage (first read voltage) is applied to the group 1-2 and the group 2-2, consecutive first sensing and second sensing are realized by adjusting the sensing time of the sensing node (SO), the sensing time of the first sensing is less than the sensing time of the second sensing, then the first read value obtained through the first sensing is determined as the read result of the memory cell of the group 1-2, and the second read value obtained through the second sensing is determined as the read result of the memory cell of the group 2-2. In other words, a sensing time of the memory cell of the group 2-2 is greater than a sensing time of the memory cell of the group 1-2, such that different degrees of the threshold voltage offsets of the group 1-2 and the group 2-2 are made up.

In an example of the present disclosure, it is determined that which read value is respectively adopted by the memory cells of the group 1-2 and the group 2-2 that are connected to the first word line WL(n) as the read result based on the grouping information of the memory cells connected to the second word line WL(n+1). Then read errors caused by threshold voltage offsets of the memory cell of the group 1-2 and the memory cell of the group 2-2 are eliminated.

In some examples, the peripheral circuit is configured to: respectively perform, based on a second read voltage and a third read voltage, the read operation on the memory cell connected to the first word line, so as to obtain first read value corresponding to the second read voltage and second read value corresponding to the third read voltage, wherein the second read voltage and the third read voltage have different offsets compared to the first read voltage.

In order to correctly read the information stored in the memory cell connected to the first word line WL(n), the read operations are respectively performed on the memory cells connected to the first selected word line based on N different read voltages Vread(q) according to the number N of groups of the memory cells connected to the second word line WL(n+1). In an example, if the memory cells connected to the second word line WL(n+1) are divided into two groups, the read operations are performed based on the second read voltage and the third read voltage, and two read voltages correspond to two read values, such that it is subsequently determined that which read value is adopted by the memory cells connected to the first word line as the read result based on the grouping information of the memory cells connected to the second word line WL(n+1). Then read errors caused by threshold voltage offsets of the memory cell of the group 1-2 and the memory cell of the group 2-2 are eliminated.

It is to be noted that, the first read voltage, the second read voltage, and the third read voltage are all for the same programmed state.

In some examples, the second read voltage is less than the third read voltage, and the threshold voltage of the memory cell of the first group is less than the threshold voltage of the memory cell of the second group. The peripheral circuit is configured to: determine the first read value as read result of the memory cell among the memory cells connected to the first word line that is adjacent to the memory cell of the first group; and determine the second read value as read result of the memory cell among the memory cells connected to the first word line that is adjacent to the memory cell of the second group.

In an example of the present disclosure, the second read voltage has a second offset compared to the first read voltage, and the third read voltage has a third offset compared to the first read voltage. The second offset is less than the third offset, and the second offset and the third offset have a same absolute value. Here, the second read voltage is less than the third read voltage.

Since the threshold voltage offset of the memory cell of the group 1-2 is less than the threshold voltage offset of the memory cell of the group 2-2, based on this, in order to correctly read the information stored in the memory cell of the group 1-2 and the memory cell of the group 2-2, the first read value obtained through the second read voltage is determined as the read result of the memory cell of the group 1-2, and the second read value obtained through the third read voltage is determined as the read result of the memory cell of the group 2-2. In other words, a read voltage of the memory cell of the group 2-2 is greater than a read voltage of the memory cell of the group 1-2, such that different degrees of the threshold voltage offsets of the group 1-2 and the group 2-2 are made up.

Figure 11:
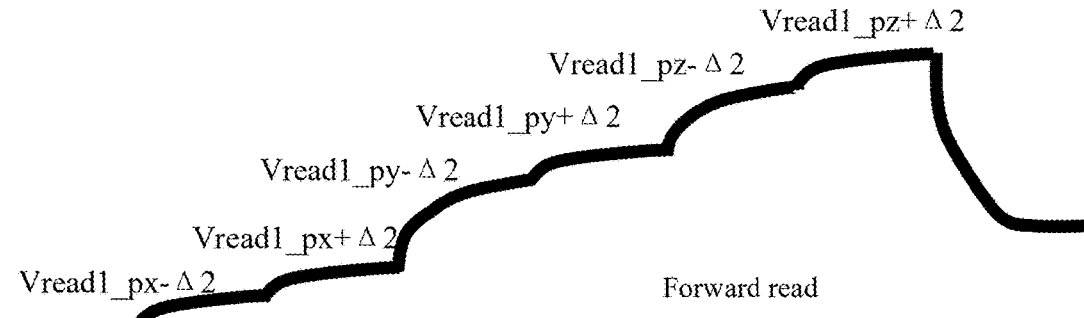
FIG. 11 is a schematic diagram of a read voltage in a read operation provided by an example of the present disclosure.
Figure 11:
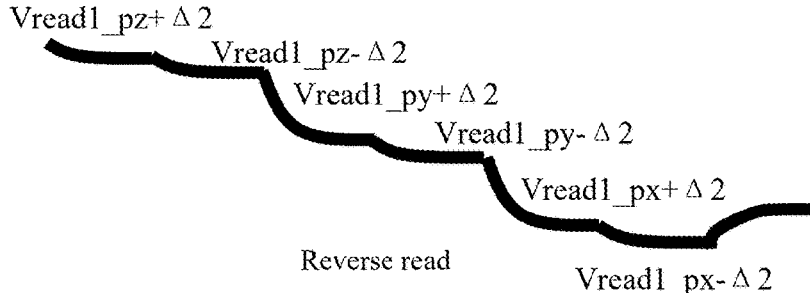

FIG. 11 is a schematic diagram of a read voltage in a read operation provided by an example of the present disclosure, as shown in FIG. 11, in the case of forward read, Vread1_px−Δ2, Vread1_px+Δ2, Vread1_py−Δ2, Vread1_py+Δ2, Vread1_pz−Δ2, and Vread1_pz+Δ2 are successively applied from low to high. In the case of reverse read, Vread1_pz+Δ2, Vread1_pz−Δ2, Vread1_py+Δ2, Vread1_py−Δ2, Vread1_px+Δ2, and Vread1_px−Δ2 are successively applied from high to low, wherein −Δ2 is the second offset, +Δ2 is the third offset, and Vread1_px, Vread1_py, and Vread1_pz are read voltages. It is to be noted that, the number of times for applying the read voltages is only an example, and is not used to limit the required number of times for applying the read voltages in each read operation in the present disclosure.

According to the memory device and a control method thereof of the present disclosure, the memory cells more and less affected by adjacent memory cell programmed later may be determined based on the grouping information of the memory cells connected to the second word line, so as to determine situation of the threshold voltage distribution offsets of various memory cells connected to the first word line, such that, it is determined that which read value is adopted by the corresponding memory cells as the read result based on the situation of the threshold voltage distribution offsets, and a coupling effect between the adjacent memory cells can be effectively corrected.

Based on the above-mentioned memory device, an example of the present disclosure further provide an operation method of a memory device. The memory device comprises: a memory cell array comprising a plurality of memory cell rows coupled to a plurality of word lines and a plurality of memory strings coupled to a plurality of bit lines, wherein the memory string comprises a plurality of memory cells connected in series. As shown in FIG. 12, the operation method comprises:

operation 1201: performing a read operation on the memory cells connected to a first word line to obtain at least two read values;

operation 1202: during the read operation performed on the memory cells connected to the first word line, dividing the memory cells connected to a second word line into at least two groups based on threshold voltages of the memory cells connected to the second word line; and operation 1203: determining read results of the memory cells connected to the first word line from the at least two read values based on grouping information of the memory cells connected to the second word line, wherein the first word line and the second word line are word lines adjacent to each other.

In some examples, the performing the read operation on the memory cells connected to the first word line to obtain the at least two read values comprises:

after applying a first read voltage to the first word line, respectively obtaining, through consecutive first sensing and second sensing, a first read value corresponding to the first sensing and a second read value corresponding to the second sensing, wherein the first sensing and the second sensing have different sensing times.

In some examples, the performing the read operation on the memory cells connected to the first word line to obtain the at least two read values comprises:

respectively performing, based on a second read voltage and a third read voltage, the read operation on the memory cells connected to the first word line, so as to obtain a first read value corresponding to the second read voltage and a second read value corresponding to the third read voltage, wherein the second read voltage and the third read voltage have different offsets compared to the first read voltage.

In some examples, during the read operation performed on the memory cells connected to the first word line, dividing the memory cells connected to the second word line into the at least two groups based on the threshold voltages of the memory cells connected to the second word line comprises:

during the read operation performed on the memory cells connected to the first word line, when the second word line is charged or discharged, obtaining a third read value through third sensing when a voltage on the second word line reaches a preset voltage, and dividing the memory cells connected to the second word line into a first group and a second group based on the third read value.

In some examples, the sensing time of the first sensing is less than the sensing time of the second sensing, and the threshold voltage of the memory cell of the first group is less than the threshold voltage of the memory cell of the second group; and determining the read results of the memory cells connected to the first word line from the at least two read values based on the grouping information of the memory cells connected to the second word line comprises:

determining the first read value as the read result of the memory cell among the memory cells connected to the first word line that is adjacent to the memory cell of the first group; and determining the second read value as the read result of the memory cell among the memory cells connected to the first word line that is adjacent to the memory cell of the second group.

In some examples, the second read voltage is less than the third read voltage, and the threshold voltage of the memory cell of the first group is less than the threshold voltage of the memory cells of the second group; and determining the read results of the memory cells connected to the first word line from the at least two read values based on the grouping information of the memory cells connected to the second word line comprises:

determining the first read value as the read result of the memory cell among the memory cells connected to the first word line that is adjacent to the memory cell of the first group; and determining the second read value as the read result of the memory cell among the memory cells connected to the first word line that is adjacent to the memory cell of the second group.

In some examples, during the read operation performed on the memory cells connected to the first word line, dividing the memory cells connected to the second word line into the at least two groups based on the threshold voltages of the memory cells connected to the second word line comprises:

in a pre-charging stage of the read operation performed on the memory cells connected to the first word line, during application of a pass voltage to the second word line, obtaining the third read value through the third sensing when the voltage on the second word line is charged to the preset voltage, and dividing the memory cells connected to the second word line into the first group and the second group based on the third read value; or in the pre-charging stage of the read operation performed on the memory cells connected to the first word line, after applying the pass voltage to the second word line, obtaining the third read value through the third sensing when the voltage on the second word line is discharged to the preset voltage, and dividing the memory cells connected to the second word line into the first group and the second group based on the third read value.

In some examples, during the read operation performed on the memory cells connected to the first word line, dividing the memory cells connected to the second word line into the at least two groups based on the threshold voltages of the memory cells connected to the second word line comprises:

in a discharging stage of the read operation performed on the memory cells connected to the first word line, when the second word line is discharged from the pass voltage, obtaining the third read value through the third sensing when the voltage on the second word line is discharged to the preset voltage, and dividing the memory cells connected to the second word line into the first group and the second group based on the third read value.

An example of the present disclosure further provide a memory system, which comprises:

one or more memory devices described in any one of the above-mentioned examples; and a memory controller coupled with the memory device and controlling the memory device.

Figure 2A:
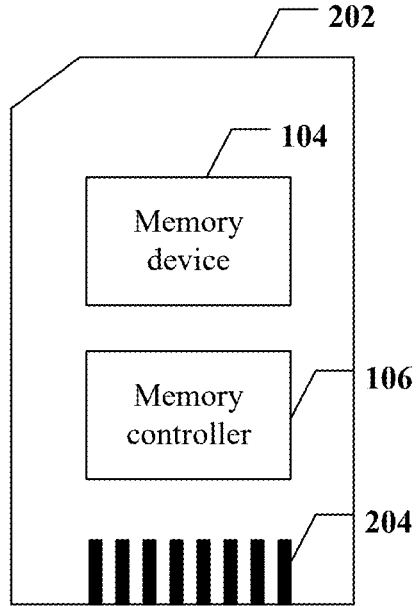
FIG. 2A is a schematic diagram of an example memory card having a memory system according to an example of the present disclosure.
Figure 2B:
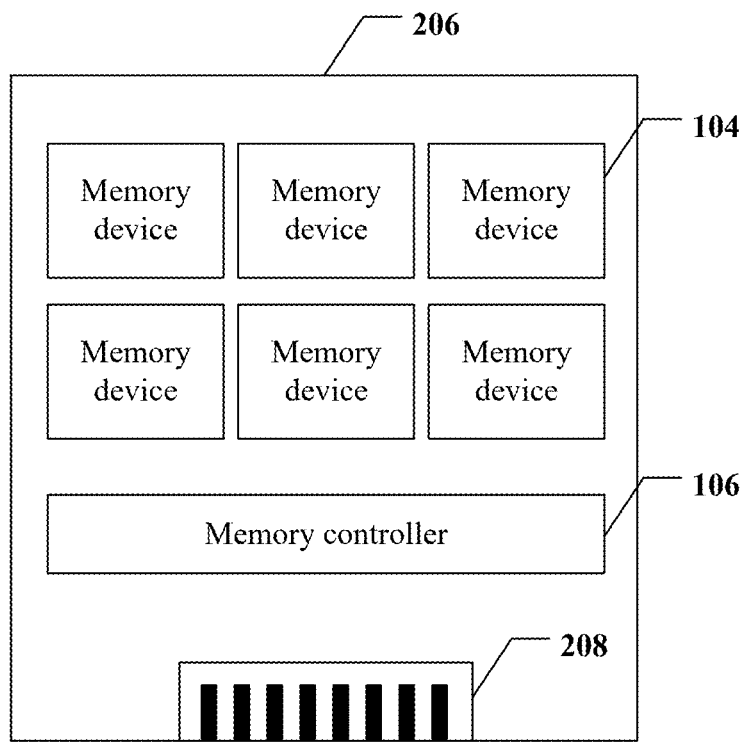
FIG. 2B is a schematic diagram of an example solid-state drive having a memory system according to an example of the present disclosure.

Here, specific structures and compositions with respect to the memory system may be referred to related structures and compositions of the memory system in FIGS. 1, 2A, and 2B. For simplicity, details are not described here again.

In some examples, the memory system comprises a memory card or a solid state drive.

Examples of the present disclosure provide a memory device and an operation method thereof, and a memory system.

In a first aspect, an example of the present disclosure provide a memory device, which comprises: a memory cell array comprising a plurality of memory cell rows coupled to a plurality of word lines and a plurality of memory strings coupled to a plurality of bit lines, wherein the memory string comprises a plurality of memory cells connected in series; and a peripheral circuit coupled to the memory cell array and configured to: perform a read operation on the memory cells connected to a first word line to obtain at least two read values; during the read operation performed on the memory cells connected to the first word line, divide the memory cells connected to a second word line into at least two groups based on threshold voltages of the memory cells connected to the second word line; and determine read results of the memory cells connected to the first word line from the at least two read values based on grouping information of the memory cells connected to the second word line, wherein the first word line and the second word line are word lines adjacent to each other.

In one optional implementation, the peripheral circuit is configured to: after applying a first read voltage on the first word line, respectively obtain, through consecutive first sensing and second sensing, a first read value corresponding to the first sensing and a second read value corresponding to the second sensing, wherein the first sensing and the second sensing have different sensing times.

In one optional implementation, the peripheral circuit is configured to: respectively perform, based on a second read voltage and a third read voltage, the read operation on the memory cells connected to the first word line, so as to obtain a first read value corresponding to the second read voltage and a second read value corresponding to the third read voltage, wherein the second read voltage and the third read voltage have different offsets compared to a first read voltage.

In one optional implementation, the peripheral circuit is configured to: during the read operation performed on the memory cells connected to the first word line, when the second word line is charged or discharged, obtain a third read value through third sensing when a voltage on the second word line reaches a preset voltage, and divide the memory cells connected to the second word line into a first group and a second group based on the third read value.

In one optional implementation, the sensing time of the first sensing is less than the sensing time of the second sensing, and the threshold voltage of the memory cell of the first group is less than the threshold voltage of the memory cell of the second group. The peripheral circuit is configured to: determine the first read value as the read result of the memory cell among the memory cells connected to the first word line that is adjacent to the memory cell of the first group; and determine the second read value as the read result of the memory cell among the memory cells connected to the first word line that is adjacent to the memory cell of the second group.

In one optional implementation, the second read voltage is less than the third read voltage, and the threshold voltage of the memory cell of the first group is less than the threshold voltage of the memory cell of the second group. The peripheral circuit is configured to: determine the first read value as the read result of the memory cell among the memory cells connected to the first word line that is adjacent to the memory cell of the first group; and determine the second read value as the read result of the memory cell among the memory cells connected to the first word line that is adjacent to the memory cell of the second group.

In one optional implementation, the peripheral circuit is configured to: in a pre-charging stage of the read operation performed on the memory cells connected to the first word line, during application of a pass voltage to the second word line, obtain the third read value through the third sensing when the voltage on the second word line is charged to the preset voltage, and divide the memory cells connected to the second word line into the first group and the second group based on the third read value; or in the pre-charging stage of the read operation performed on the memory cells connected to the first word line, after applying the pass voltage to the second word line, obtain the third read value through the third sensing when the voltage on the second word line is discharged to the preset voltage, and divide the memory cells connected to the second word line into the first group and the second group based on the third read value.

In one optional implementation, the peripheral circuit is configured to: in a discharging stage of the read operation performed on the memory cells connected to the first word line, when the second word line is discharged from the pass voltage, obtain the third read value through the third sensing when the voltage on the second word line is discharged to the preset voltage, and divide the memory cells connected to the second word line into the first group and the second group based on the third read value.

In a second aspect, an example of the present disclosure provide an operation method of a memory device, wherein the memory device comprises: a memory cell array comprising a plurality of memory cell rows coupled to a plurality of word lines and a plurality of memory strings coupled to a plurality of bit lines, wherein the memory string comprises a plurality of memory cells connected in series. The method comprises: performing a read operation on the memory cells connected to a first word line to obtain at least two read values; during the read operation performed on the memory cells connected to the first word line, dividing the memory cells connected to a second word line into at least two groups based on threshold voltages of the memory cells connected to the second word line; and determining read results of the memory cells connected to the first word line from the at least two read values based on grouping information of the memory cells connected to the second word line, wherein the first word line and the second word line are word lines adjacent to each other.

In one optional implementation, the performing the read operation on the memory cells connected to the first word line to obtain the at least two read values comprises: after applying a first read voltage on the first word line, respectively obtaining, through consecutive first sensing and second sensing, a first read value corresponding to the first sensing and a second read value corresponding to the second sensing, wherein the first sensing and the second sensing have different sensing times.

In one optional implementation, the performing the read operation on the memory cells connected to the first word line to obtain the at least two read values comprises: respectively performing, based on a second read voltage and a third read voltage, the read operation on the memory cells connected to the first word line, so as to obtain a first read value corresponding to the second read voltage and a second read value corresponding to the third read voltage, wherein the second read voltage and the third read voltage have different offsets compared to a first read voltage.

In one optional implementation, during the read operation performed on the memory cells connected to the first word line, dividing the memory cells connected to the second word line into the at least two groups based on the threshold voltages of the memory cells connected to the second word line comprises: during the read operation performed on the memory cells connected to the first word line, when the second word line is charged or discharged, obtaining a third read value through third sensing when a voltage on the second word line reaches a preset voltage, and dividing the memory cells connected to the second word line into a first group and a second group based on the third read value.

In one optional implementation, the sensing time of the first sensing is less than the sensing time of the second sensing, and the threshold voltage of the memory cell of the first group is less than the threshold voltage of the memory cell of the second group. Determining the read results of the memory cells connected to the first word line from the at least two read values based on the grouping information of the memory cells connected to the second word line comprises: determining the first read value as the read result of the memory cell among the memory cells connected to the first word line that is adjacent to the memory cell of the first group; and determining the second read value as the read result of the memory cell among the memory cells connected to the first word line that is adjacent to the memory cell of the second group.

In one optional implementation, the second read voltage is less than the third read voltage, and the threshold voltage of the memory cell of the first group is less than the threshold voltage of the memory cell of the second group. Determining the read results of the memory cells connected to the first word line from the at least two read values based on the grouping information of the memory cells connected to the second word line comprises: determining the first read value as the read result of the memory cell among the memory cells connected to the first word line that is adjacent to the memory cell of the first group; and determining the second read value as the read result of the memory cell among the memory cells connected to the first word line that is adjacent to the memory cell of the second group.

In one optional implementation, during the read operation performed on the memory cells connected to the first word line, dividing the memory cells connected to the second word line into the at least two groups based on the threshold voltages of the memory cells connected to the second word line comprises: in a pre-charging stage of the read operation performed on the memory cells connected to the first word line, during application of a pass voltage to the second word line, obtaining the third read value through the third sensing when the voltage on the second word line is charged to the preset voltage, and dividing the memory cells connected to the second word line into the first group and the second group based on the third read value; or in the pre-charging stage of the read operation performed on the memory cells connected to the first word line, after applying the pass voltage to the second word line, obtaining the third read value through the third sensing when the voltage on the second word line is discharged to the preset voltage, and dividing the memory cells connected to the second word line into the first group and the second group based on the third read value.

In one optional implementation, during the read operation performed on the memory cells connected to the first word line, dividing the memory cells connected to the second word line into the at least two groups based on the threshold voltages of the memory cells connected to the second word line comprises: in a discharging stage of the read operation performed on the memory cells connected to the first word line, when the second word line is discharged from the pass voltage, obtaining the third read values through the third sensing when the voltage on the second word line is discharged to the preset voltage, and dividing the memory cells connected to the second word line into the first group and the second group based on the third read value.

In a third aspect, an example of the present disclosure provide a memory system, which comprises: the memory device as described in the first aspect; and a memory controller coupled to the memory device and configured to control the memory device.

The examples of the present disclosure provide the memory device and the operation method thereof, and the memory system. The memory device comprises: the memory cell array comprising the plurality of memory cell rows coupled to the plurality of word lines and the plurality of memory strings coupled to the plurality of bit lines, wherein the memory string comprises the plurality of memory cells connected in series; and the peripheral circuit coupled to the memory cell array and configured to: perform the read operation on the memory cells connected to the first word line to obtain the at least two read values; during the read operation performed on the memory cells connected to the first word line, divide the memory cells connected to the second word line into the at least two groups based on the threshold voltages of the memory cells connected to the second word line; and determine the read results of the memory cells connected to the first word line from the at least two read values based on the grouping information of the memory cells connected to the second word line, wherein the first word line and the second word line are the word lines adjacent to each other. According to the memory device of the present disclosure, it is determined that which read value is adopted by the memory cells connected to the first word line as the read result based on the grouping information of the memory cells connected to the second word line, such that a coupling effect between the adjacent memory cells can be effectively corrected.

It is to be understood that, references to "one example" or "an example" throughout this specification mean that particular features, structures, or characteristics related to the example are included in at least one example of the present disclosure. Therefore, "in one example" or "in an example" appearing at any place of the whole specification does not necessarily refer to the same example. Furthermore, these particular features, structures, or characteristics may be incorporated in one or more examples in any suitable manner. It is to be understood that, in various examples of the present disclosure, sequence numbers of the above processes do not indicate an execution sequence, and an execution sequence of various processes shall be determined by functionalities and intrinsic logics thereof, and shall constitute no limitation on an implementation process of the examples of the present disclosure. The above sequence numbers of the examples of the present disclosure are only for description, and do not represent goodness and badness of the examples.

The above descriptions are merely preferred implementations of the present disclosure, and not intended to limit the patent scope of the present disclosure. Equivalent structure transformation made by utilizing the contents of the specification and the drawings of the present disclosure under the inventive concept of the present disclosure, or direct/indirect application to other related technical fields are both encompassed within the patent protection scope of the present disclosure.

What is claimed is:

1. A memory device, comprising:
a memory cell array including a plurality of memory cells, the plurality of memory cells constituting a plurality of memory cell rows coupled to a plurality of word lines and a plurality of memory strings coupled to a plurality of bit lines; and a peripheral circuit coupled to the memory cell array and configured to:
perform a read operation on the memory cells connected to a first word line to obtain at least two read values;
during the read operation performed on the memory cells connected to the first word line, divide the memory cells connected to a second word line into at least two groups based on threshold voltages of the memory cells connected to the second word line; and
determine read results of the memory cells connected to the first word line from the at least two read values based on grouping information of the memory cells connected to the second word line, wherein the first word line and the second word line are word lines adjacent to each other.

2. The memory device of claim 1, wherein the peripheral circuit is configured to, after applying a first read voltage on the first word line, respectively obtain, through consecutive first sensing and second sensing, a first read value corresponding to the first sensing and a second read value corresponding to the second sensing, wherein the first sensing and the second sensing have different sensing times.

3. The memory device of claim 1, wherein the peripheral circuit is configured to respectively perform, based on a second read voltage and a third read voltage, the read operation on the memory cells connected to the first word line, so as to obtain a first read value corresponding to the second read voltage and a second read value corresponding to the third read voltage, wherein the second read voltage and the third read voltage have different offsets compared to a first read voltage.

4. The memory device of claim 2, wherein the peripheral circuit is configured to, during the read operation performed on the memory cells connected to the first word line, when the second word line is charged or discharged:
obtain a third read value through third sensing when a voltage on the second word line reaches a preset voltage; and
divide the memory cells connected to the second word line into a first group and a second group based on the third read value.

5. The memory device of claim 4, wherein
a sensing time of the first sensing is less than a sensing time of the second sensing, and threshold voltages of the memory cells of the first group is less than threshold voltages of the memory cells of the second group; and
the peripheral circuit is configured to:
determine the first read value as the read result of the memory cell among the memory cells connected to the first word line that is adjacent to the memory cells of the first group; and
determine the second read value as the read result of the memory cell among the memory cells connected to the first word line that is adjacent to the memory cells of the second group.

6. The memory device of claim 4, wherein
a second read voltage is less than a third read voltage, and threshold voltages of the memory cells of the first group is less than threshold voltages of the memory cells of the second group; and
the peripheral circuit is configured to:
determine the first read value as the read result of the memory cell among the memory cells connected to the first word line that is adjacent to the memory cells of the first group; and determine the second read value as the read result of the memory cells among the memory cells connected to the first word line that is adjacent to the memory cells of the second group.

7. The memory device of claim 4, wherein the peripheral circuit is configured to:

in a pre-charging stage of the read operation performed on the memory cells connected to the first word line, during application of a pass voltage to the second word line:

obtain the third read value through the third sensing when the voltage on the second word line is charged to the preset voltage; and divide the memory cells connected to the second word line into the first group and the second group based on the third read value; or in the pre-charging stage of the read operation performed on the memory cells connected to the first word line, after applying the pass voltage to the second word line:

obtain the third read value through the third sensing when the voltage on the second word line is discharged to the preset voltage; and divide the memory cells connected to the second word line into the first group and the second group based on the third read value.

8. The memory device of claim 4, wherein the peripheral circuit is configured to, in a discharging stage of the read operation performed on the memory cells connected to the first word line, when the second word line is discharged from a pass voltage:

obtain the third read value through the third sensing when the voltage on the second word line is discharged to the preset voltage; and divide the memory cells connected to the second word line into the first group and the second group based on the third read value.

9. A method of operating a memory device, wherein the memory device includes: a memory cell array including a plurality of memory cells, the plurality of memory cells constituting a plurality of memory cell rows coupled to a plurality of word lines and a plurality of memory strings coupled to a plurality of bit lines, the method comprises:

performing a read operation on the memory cells connected to a first word line to obtain at least two read values;

during the read operation performed on the memory cells connected to the first word line, dividing the memory cells connected to a second word line into at least two groups based on threshold voltages of the memory cells connected to the second word line; and determining read results of the memory cells connected to the first word line from the at least two read values based on grouping information of the memory cells connected to the second word line, wherein the first word line and the second word line are word lines adjacent to each other.

10. The method of claim 9, wherein the performing the read operation on the memory cells connected to the first word line to obtain the at least two read values includes, after applying a first read voltage on the first word line, respectively obtaining, through consecutive first sensing and second sensing, a first read value corresponding to the first sensing and a second read value corresponding to the second sensing, wherein the first sensing and the second sensing have different sensing times.

11. The method of claim 9, wherein the performing the read operation on the memory cells connected to the first word line to obtain the at least two read values includes respectively performing, based on a second read voltage and a third read voltage, the read operation on the memory cells connected to the first word line, so as to obtain a first read value corresponding to the second read voltage and a second read value corresponding to the third read voltage, wherein the second read voltage and the third read voltage have different offsets compared to a first read voltage.

12. The method of claim 10, wherein, during the read operation performed on the memory cells connected to the first word line, dividing the memory cells connected to the second word line into the at least two groups based on the threshold voltages of the memory cells connected to the second word line includes, during the read operation performed on the memory cells connected to the first word line, when the second word line is charged or discharged:

obtaining a third read value through third sensing when a voltage on the second word line reaches a preset voltage; and dividing the memory cells connected to the second word line into a first group and a second group based on the third read value.

13. The method of claim 12, wherein a sensing time of the first sensing is less than a sensing time of the second sensing, and threshold voltages of the memory cells of the first group is less than threshold voltages of the memory cells of the second group; and determining the read results of the memory cells connected to the first word line from the at least two read values based on the grouping information of the memory cells connected to the second word line includes:

determining the first read value as the read result of the memory cell among the memory cells connected to the first word line that is adjacent to the memory cells of the first group; and determining the second read value as the read result of the memory cell among the memory cells connected to the first word line that is adjacent to the memory cells of the second group.

14. The method of claim 12, wherein a second read voltage is less than a third read voltage, and threshold voltages of the memory cells of the first group is less than threshold voltages of the memory cells of the second group; and determining the read results of the memory cells connected to the first word line from the at least two read values based on the grouping information of the memory cells connected to the second word line includes:

determining the first read value as the read result of the memory cell among the memory cells connected to the first word line that is adjacent to the memory cells of the first group; and determining the second read value as the read result of the memory cell among the memory cells connected to the first word line that is adjacent to the memory cells of the second group.

15. The method of claim 12, wherein, during the read operation performed on the memory cells connected to the first word line, dividing the memory cells connected to the second word line into the at least two groups based on the threshold voltages of the memory cells connected to the second word line includes:

in a pre-charging stage of the read operation performed on the memory cells connected to the first word line, during application of a pass voltage to the second word line:

obtaining the third read value through the third sensing when the voltage on the second word line is charged to the preset voltage; and dividing the memory cells connected to the second word line into the first group and the second group based on the third read value; or in the pre-charging stage of the read operation performed on the memory cells connected to the first word line, after applying the pass voltage to the second word line:

obtaining the third read value through the third sensing when the voltage on the second word line is discharged to the preset voltage; and dividing the memory cells connected to the second word line into the first group and the second group based on the third read value.

16. The method of claim 12, wherein, during the read operation performed on the memory cells connected to the first word line, dividing the memory cells connected to the second word line into the at least two groups based on the threshold voltages of the memory cells connected to the second word line includes, in a discharging stage of the read operation performed on the memory cells connected to the first word line, when the second word line is discharged from a pass voltage:

obtaining the third read value through the third sensing when the voltage on the second word line is discharged to the preset voltage; and dividing the memory cells connected to the second word line into the first group and the second group based on the third read value.

17. A memory system, comprising:

a memory device including:

a memory cell array including a plurality of memory cells, the plurality of memory cells constituting a plurality of memory cell rows coupled to a plurality of word lines and a plurality of memory strings coupled to a plurality of bit lines; and a peripheral circuit coupled to the memory cell array and configured to:

perform a read operation on the memory cells connected to a first word line to obtain at least two read values;

during the read operation performed on the memory cells connected to the first word line, divide the memory cells connected to a second word line into at least two groups based on threshold voltages of the memory cells connected to the second word line; and determine read results of the memory cells connected to the first word line from the at least two read values based on grouping information of the memory cells connected to the second word line, wherein the first word line and the second word line are word lines adjacent to each other; and a memory controller coupled to the memory device and configured to control the memory device.

18. The memory system claim 17, wherein the peripheral circuit is configured to, after applying a first read voltage on the first word line, respectively obtain, through consecutive first sensing and second sensing, a first read value corresponding to the first sensing and a second read value corresponding to the second sensing, wherein the first sensing and the second sensing have different sensing times.

19. The memory system of claim 17, wherein the peripheral circuit is configured to respectively perform, based on a second read voltage and a third read voltage, the read operation on the memory cells connected to the first word line, so as to obtain a first read value corresponding to the second read voltage and a second read value corresponding to the third read voltage, wherein the second read voltage and the third read voltage have different offsets compared to a first read voltage.

20. The memory system of claim 18, wherein the peripheral circuit is configured to, during the read operation performed on the memory cells connected to the first word line, when the second word line is charged or discharged:

obtain a third read value through third sensing when a voltage on the second word line reaches a preset voltage; and divide the memory cells connected to the second word line into a first group and a second group based on the third read value.

* * * * *